US012777842B2

(12) United States Patent
Song et al.

(10) Patent No.: US 12,777,842 B2

(45) Date of Patent: Oct. 27, 2026

(54) LIGHT EMITTING DEVICE AND LIGHT EMITTING DISPLAY INCLUDING THE SAME

(71) Applicant: LG Display Co., Ltd., Seoul (KR)

(72) Inventors: Wook Song, Paju-si (KR); Min Hyeong Hwang, Paju-si (KR); Myeong Seon Cho, Paju-si (KR); Chun Ki Kim, Paju-si (KR); Sae Mi Park, Paju-si (KR); Young Jun Yu, Paju-si (KR); Jung Keun Kim, Paju-si (KR); Byung Soo Kim, Paju-si (KR); Sang Beom Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 955 days.

(21) Appl. No.: 18/079,709

(22) Filed: Dec. 12, 2022

(65) Prior Publication Data

US 2023/0217815 A1 Jul. 6, 2023

(30) Foreign Application Priority Data

Dec. 31, 2021 (KR) ........................ 10-2021-0194800

(51) Int. Cl.

| | |
|---|---|
| ***H10K 85/60*** | (2023.01) |
| ***H10K 59/35*** | (2023.01) |
| *H10K 50/16* | (2023.01) |
| *H10K 50/18* | (2023.01) |
| *H10K 59/12* | (2023.01) |

(52) U.S. Cl.

CPC ........... *H10K 85/654* (2023.02); *H10K 59/35* (2023.02); *H10K 85/633* (2023.02); *H10K 85/636* (2023.02); *H10K 85/6572* (2023.02); *H10K 50/16* (2023.02); *H10K 50/18* (2023.02); *H10K 59/12* (2023.02); *H10K 85/624* (2023.02); *H10K 85/6574* (2023.02)

(58) Field of Classification Search

CPC ............................... H01K 50/13; H01K 50/16

See application file for complete search history.

(56) References Cited

U.S. PATENT DOCUMENTS

| | | | | |
|---|---|---|---|---|
| 11,239,427 | B2 | 2/2022 | Lee et al. | |
| 2011/0073844 | A1 | 3/2011 | Pieh et al. | |
| 2014/0299192 | A1 | 10/2014 | Lee et al. | |
| 2016/0176801 | A1 | 6/2016 | Kato et al. | |
| 2018/0166647 | A1 | 6/2018 | Shin et al. | |
| 2019/0319195 | A1 | 10/2019 | Lee et al. | |
| 2019/0348613 | A1 | 11/2019 | Kim et al. | |
| 2020/0052234 | A1 | 2/2020 | Kum et al. | |
| 2021/0130355 | A1 | 5/2021 | Goa et al. | |
| 2021/0226133 | A1 | 7/2021 | Oh et al. | |
| 2021/0273192 | A1 | 9/2021 | Kim et al. | |
| 2021/0384436 | A1 | 12/2021 | Yoon et al. | |
| 2022/0246863 | A1 | 8/2022 | Lee et al. | |
| 2023/0056059 | A1 | 2/2023 | Lee et al. | |
| 2023/0217815 | A1* | 7/2023 | Song .................... | H10K 85/633 257/40 |

(Continued)

FOREIGN PATENT DOCUMENTS

| | | |
|---|---|---|
| CN | 102034934 A | 4/2011 |
| CN | 108473394 A | 8/2018 |
| CN | 109476607 A | 3/2019 |

(Continued)

OTHER PUBLICATIONS

Office Action issued on May 15, 2025 in Koren Patent Application No. 10-2021-0194800.

Jiangshan Chen et al.: "Hybrid white OLEDs with fluorophors and phosphors", Materials Today, vol. 17, No. 4, May 1, 2014 (May 1, 2014), pp. 175-183, XP055619585, Amsterdam, NL.

Yanqin Miao et al.: "High-efficiency/CRI/color stability warm white organic light-emitting diodes by incorporating ultrathin phosphorescence layers in a blue fluorescence layer", Nanophotonics, vol. 7, No. 1, Jul. 22, 2017 (Jul. 22, 2017), pp. 295-304, XP093048208.

Extended European Search Report dated May 30, 2023, issued in corresponding European Patent Application No. 22216748.8.

(Continued)

*Primary Examiner* — Geraldina Visconti

(74) *Attorney, Agent, or Firm* — Morgan, Lewis & Bockius LLP

(57) ABSTRACT

A light emitting device and a light emitting display including the same. The light emitting device includes an anode and a cathode facing each other, a first stack and a second stack disposed between the anode and the cathode, the first stack including a first electron transport layer comprising a first material represented by Formula 1, a first blue light emitting layer containing a boron-based compound emitting light having a wavelength of 430 nm to 480 nm, and a first electron-blocking layer including a second material including a spirofluorene group, and at least one hydrogen atom on at least one side of the spirofluorene group is substituted by deuterium, and the second stack including at least two phosphorescent light emitting layers emitting light having a longer wavelength than that of the light emitted by the first blue light emitting layer, and a charge generation layer.

[Formula 1]

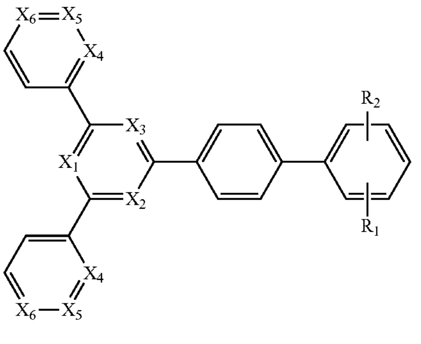

20 Claims, 6 Drawing Sheets

(56) References Cited

U.S. PATENT DOCUMENTS

| | | | | |
|---|---|---|---|---|
| 2023/0217821 A1* | 7/2023 | Song | H10K 85/60 257/40 |
| 2023/0255078 A1* | 8/2023 | Song | C07D 209/08 257/40 |

FOREIGN PATENT DOCUMENTS

| | | | |
|---|---|---|---|
| EP | 3 483 146 | A1 | 5/2019 |
| EP | 3 923 364 | A1 | 12/2021 |
| EP | 4207995 | A1 | 7/2023 |
| JP | 2016132642 | A | 7/2016 |
| JP | 2019161218 | A | 9/2019 |
| KR | 10-2013-0051875 | A | 5/2013 |
| KR | 10-2017-0027691 | A | 3/2017 |
| KR | 10-2017-0084917 | A | 7/2017 |
| KR | 10-2018-0001826 | A | 1/2018 |
| KR | 10-2018-0005534 | A | 1/2018 |
| KR | 102107199 | B1 | 5/2020 |
| KR | 10-2020-0081979 | A | 7/2020 |
| KR | 10-2021-0072414 | A | 6/2021 |
| TW | 201821590 | A | 6/2018 |
| WO | 2014/010824 | A1 | 1/2014 |
| WO | 2017/122988 | A1 | 7/2017 |
| WO | 2020/067593 | A1 | 4/2020 |
| WO | 2020/138876 | A1 | 7/2020 |
| WO | 2021/034039 | A1 | 2/2021 |

OTHER PUBLICATIONS

Extended European Search Report dated May 31, 2023, issued in corresponding European Patent Application No. 22215494.0.

Office Action issued on Dec. 12, 2023 in Taiwanese Patent Application No. 111147657 Note: WO 2020/138876 and the Jiangshan Chen journal article cited therein are already of record.

Notice of Allowance issued on Jan. 25, 2024 in Japanese Patent Application No. 2022-204068 with English translation.

* cited by examiner

LIGHT EMITTING DEVICE AND LIGHT EMITTING DISPLAY INCLUDING THE SAME

CROSS-REFERENCE TO RELATED APPLICATION

This application claims the benefit of and the priority to Korean Patent Application No. 10-2021-0194800, filed on Dec. 31, 2021, which is hereby incorporated by reference as if fully set forth herein.

BACKGROUND

1. Technical Field

The present disclosure relates to a light emitting device, and more particularly to a light emitting device including a blue fluorescent stack and a phosphorescent stack. The light emitting device may be capable of improving the efficiency of a fluorescent blue light emitting layer without increasing a driving voltage. The present disclosure also relates to a light emitting display including the light emitting device disclosed herein.

2. Description of the Related Art

Recently, with the arrival of the information age, displays for visually rendering signals based on electrical information have rapidly developed. In response thereto, a variety of displays having excellent characteristics, such as a thin profile, low weight, and low power consumption, have been developed and are rapidly replacing existing cathode ray tubes (CRTs).

Among them, a light emitting display that does not require a separate light source and has a light emitting device in the display panel without a separate light source to make the display compact and realize clear color has been considered a competitive application.

Light emitting devices currently used in light emitting displays may require higher efficiency to realize a desired image quality, and may be desirably implemented in the form of a plurality of stacks. However, the use of multiple stacks may increase the driving voltage in proportion to the number of stacks, and there may be a limitation on the extent to which efficiency may be increased using only a plurality of stacks due to the differences in the emission color and emission mechanism implemented between each stack. In addition, there may be a problem in that the lifespan may be shortened when changing materials to increase efficiency.

SUMMARY

Accordingly, the present disclosure is directed to a light emitting device and a light emitting display including the same that may substantially obviate one or more problems due to the limitations and disadvantages of the related art.

It is an object of the present disclosure to provide a light emitting device that may be capable of improving both the driving voltage and lifespan to desired levels based on modification of a fluorescent light emitting layer having low internal quantum efficiency and structures adjacent thereto. It is another object of the present disclosure to provide a light emitting display including the light emitting device disclosed herein.

Objects of the present disclosure are not limited to the above-mentioned objects. Additional advantages, objects, and features of the disclosure that are not mentioned may be understood based on following descriptions, may be more clearly understood based on aspects of the present disclosure, and/or may be learned from practice of the disclosure. The objects and other advantages of the disclosure may be realized and attained by the structures described in the detailed description and claims as well as the appended drawings.

To achieve these and other advantages and in accordance with the objects of the disclosure, as embodied and broadly described herein, a light emitting device includes an anode and a cathode facing each other, a first stack and a second stack disposed between the anode and the cathode, the first stack including a first electron transport layer including a first material represented by Formula 1, a first blue light emitting layer containing a boron-based compound emitting light having a wavelength of 430 nm to 480 nm, and a first electron-blocking layer including a second material including a spirofluorene group, and at least one hydrogen atom on at least one side of the spirofluorene group is substituted by deuterium, the second stack includes at least two phosphorescent light emitting layers emitting light having a longer wavelength than that emitted by the first blue light emitting layer, and a charge generation layer disposed between the first stack and the second stack, wherein the Formula 1 is:

[Formula 1]

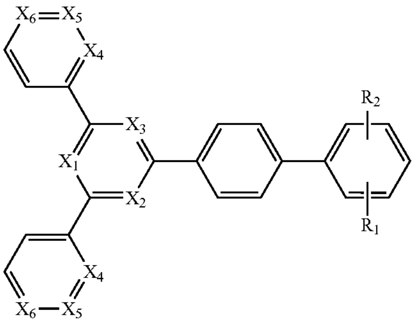

where $R_1$ and $R_2$ are each independently selected from a cycloalkyl group, an aryl group, and a heteroaryl group, $X_1$, $X_2$, and $X_3$ are each independently N or CH, and $X_4$, $X_5$ or $X_6$ is N, and remaining of $X_4$, $X_5$, and $X_6$ are CH.

The first electron transport layer may contain a first material having high electron transport efficiency.

The first electron-blocking layer may be formed of a compound containing spirofluorene.

The electron-blocking layer may be in contact with one surface of the blue light emitting layer, the electron transport layer may be in contact with the other surface of the blue light emitting layer, and one surface and the other surface of the blue light emitting layer may face each other, with the thickness of the blue light emitting layer interposed therebetween.

In another aspect of the present disclosure, a light emitting display includes a substrate including a plurality of subpixels, each of the subpixels includes a thin film transistor disposed therein, and a light emitting device connected to the thin film transistor, the light emitting device including an anode and a cathode facing each other, a first stack and a second stack disposed between the anode and the cathode, the first stack including a first electron transport layer including a first material represented by Formula 1, a first electron-blocking layer including a second material including a spirofluorene group, and at least one hydrogen atom on at least one side of the spirofluorene group is substituted by deuterium, and a first blue light emitting layer containing a boron-based compound emitting light having a wavelength of 430 nm to 480 nm, and the second stack including at least two phosphorescent light emitting layers emitting light having a longer wavelength than a wavelength of light emitted by the first blue light emitting layer, and a charge generation layer disposed between the first stack and the second stack, wherein the Formula 1 is:

[Formula 1]

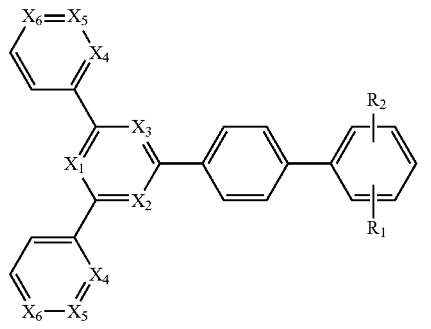

where $R_1$ and $R_2$ are each independently selected from a cycloalkyl group, an aryl group, and a heteroaryl group, $X_1$, $X_2$, and $X_3$ are each independently N or CH, and $X_4$, $X_5$ or $X_6$ is N, and remaining of $X_4$, $X_5$, and $X_6$ are CH.

It is to be understood that both the foregoing general description and the following detailed description of the present disclosure are merely by way of example and are intended to provide further explanation of the inventive concept as claimed.

BRIEF DESCRIPTION OF THE DRAWINGS

The accompanying drawings, which are included to provide a further understanding of the disclosure and are incorporated in and constitute a part of this application, illustrate example embodiments of the disclosure and together with the description serve to explain the principle of the disclosure.

DETAILED DESCRIPTION

Figure 1A:
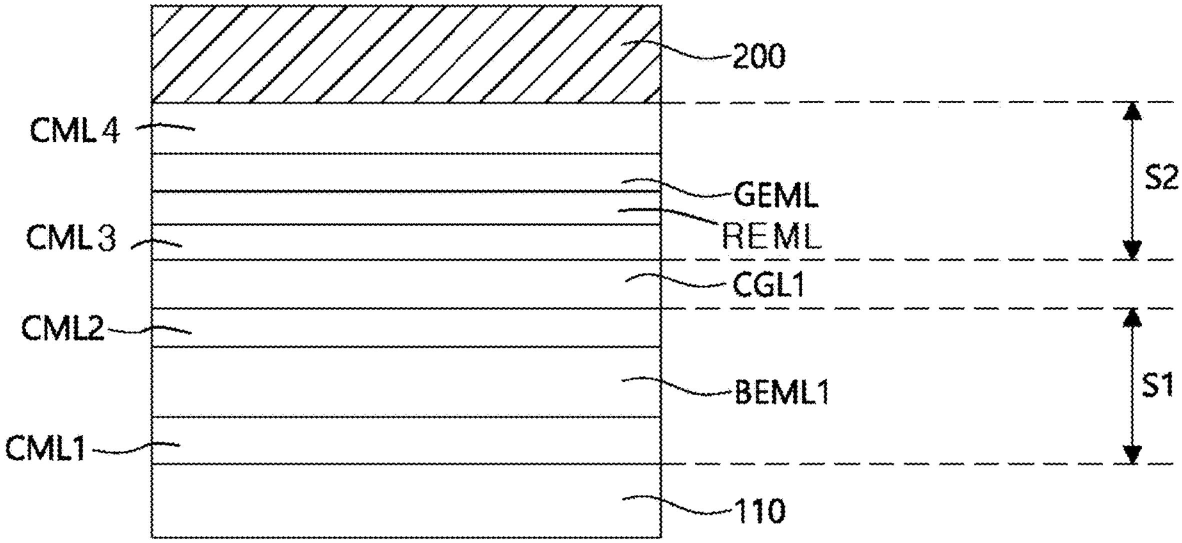
FIGS. 1A and 1B each illustrates a schematic cross-sectional view of a light emitting device according to an example embodiment of the present disclosure.

Reference will now be made in detail to example embodiments of the present disclosure, examples of which are illustrated in the accompanying drawings. Wherever possible, the same reference numbers will be used throughout the drawings to refer to the same or like parts, unless otherwise specified.

Advantages and features of the present disclosure, and a method of achieving the advantages and features will become apparent with reference to the example embodiments described herein in detail together with the accompanying drawings. The present disclosure should not be construed as limited to the example embodiments as disclosed below, and may be embodied in various different forms. Thus, these example embodiments are set forth only to make the present disclosure sufficiently complete, and to assist those skilled in the art to fully understand the scope of the present disclosure. The protected scope of the present disclosure is defined by the claims and their equivalents.

In the following description of the present disclosure, where the detailed description of the relevant known steps, elements, functions, technologies, and configurations may unnecessarily obscure an important point of the present disclosure, a detailed description of such steps, elements, functions, technologies, and configurations maybe omitted. In addition, the names of elements used in the following description are selected in consideration of clarity of description of the specification, and may differ from the names of elements of actual products. Furthermore, in the following detailed description of the present disclosure, numerous specific details are set forth in order to provide a sufficiently thorough understanding of the present disclosure. However, it will be understood that the present disclosure may be practiced without these specific details. In other instances, known methods, procedures, components, and circuits have not been described in detail so as not to unnecessarily obscure aspects of the present disclosure.

The shapes, sizes, ratios, angles, numbers, and the like, which are illustrated in the drawings to describe various example embodiments of the present disclosure are merely given by way of example. The disclosure is not limited to the illustrations in the drawings.

In the present specification, where terms such as "including," "having," "comprising," and the like are used, one or more components may be added, unless the term, such as "only," is used. As used herein, the term "and/or" includes a single associated listed item and any and all of the combinations of two or more of the associated listed items.

An expression such as "at least one of" when preceding a list of elements may modify the entire list of elements and may not modify the individual elements of the list. The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The terminology used herein is to describe particular aspects and is not intended to limit the present disclosure. As used herein, the terms "a" and "an" used to describe an element in the singular form is intended to include a plurality of elements. An element described in the singular form is intended to include a plurality of elements, and vice versa, unless the context clearly indicates otherwise.

In construing a component or numerical value, the component or the numerical value is to be construed as including an error or tolerance range even where no explicit description of such an error or tolerance range is provided.

In describing the various example embodiments of the present disclosure, where the positional relationship between two elements is described using terms, such as "on", "above", "under" and "next to", at least one intervening element may be present between the two elements, unless "immediate(ly)" or "direct(ly)" or "close(ly) is used. It will be understood that when an element or layer is referred to as being "connected to", or "coupled to" another element or layer, it may be directly connected to or coupled to the other element or layer, or one or more intervening elements or layers may be present.

In describing the various example embodiments of the present disclosure, when terms such as "after," "subsequently," "next," and "before," are used to describe the temporal relationship between two events, another event may occur therebetween, unless a more limiting term, such as "just," "immediate(ly)," or "directly" is used.

In describing the various example embodiments of the present disclosure, terms such as "first" and "second" may be used to describe a variety of components. These terms aim to distinguish the same or similar components from one another and do not limit the components. Accordingly, throughout the specification, a "first" component may be the same as a "second" component within the technical concept of the present disclosure, unless specifically mentioned otherwise.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

As used herein, the term "doped" layer refers to a layer including a material that accounts for most of the weight of a layer, and a dopant material (for example, n-type and p-type materials, or organic and inorganic substances) having physical properties different from the material that occupies most of the weight ratio of the layer. Apart from the differences in properties, the material and the dopant material may also differ in terms of their amounts in the doped layer. For example, the material that accounts for most of the weight of a layer may be a host material that is a major component while the dopant material may be a minor component. The host material accounts for most of the weight of the doped layer. The dopant material is added in an amount less than 30% by weight, based on a total weight of the host material in the doped layer. A "doped" layer may be a layer that is used to distinguish a host material from a dopant material of a certain layer, in consideration of the weight ratio. For example, if all of the materials constituting a certain layer are organic materials, at least one of the materials constituting the layer is n-type and the other is p-type, when the n-type material is present in an amount of less than 30 wt %, or when the p-type material is present in an amount of less than 30 wt %, the layer is considered to be a "doped" layer.

Also, the term "undoped" refers to layers that are not "doped". For example, a layer may be an "undoped" layer when the layer contains a single material or a mixture including materials having the same properties as each other. For example, if at least one of the materials constituting a certain layer is p-type and none of the materials constituting the layer are n-type, the layer is considered to be an "undoped" layer. For example, if at least one of the materials constituting a layer is an organic material and none of the materials constituting the layer are inorganic materials, the layer is considered to be an "undoped" layer.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale in which each of elements is illustrated in the accompanying drawings may differ from an actual scale. Thus, the illustrated elements are not limited to the specific scale in which they are illustrated in the drawings.

Hereinafter, a light emitting device according to an example embodiment of the present disclosure and a light emitting display including the same will be described with reference to the drawings.

Figure 1B:
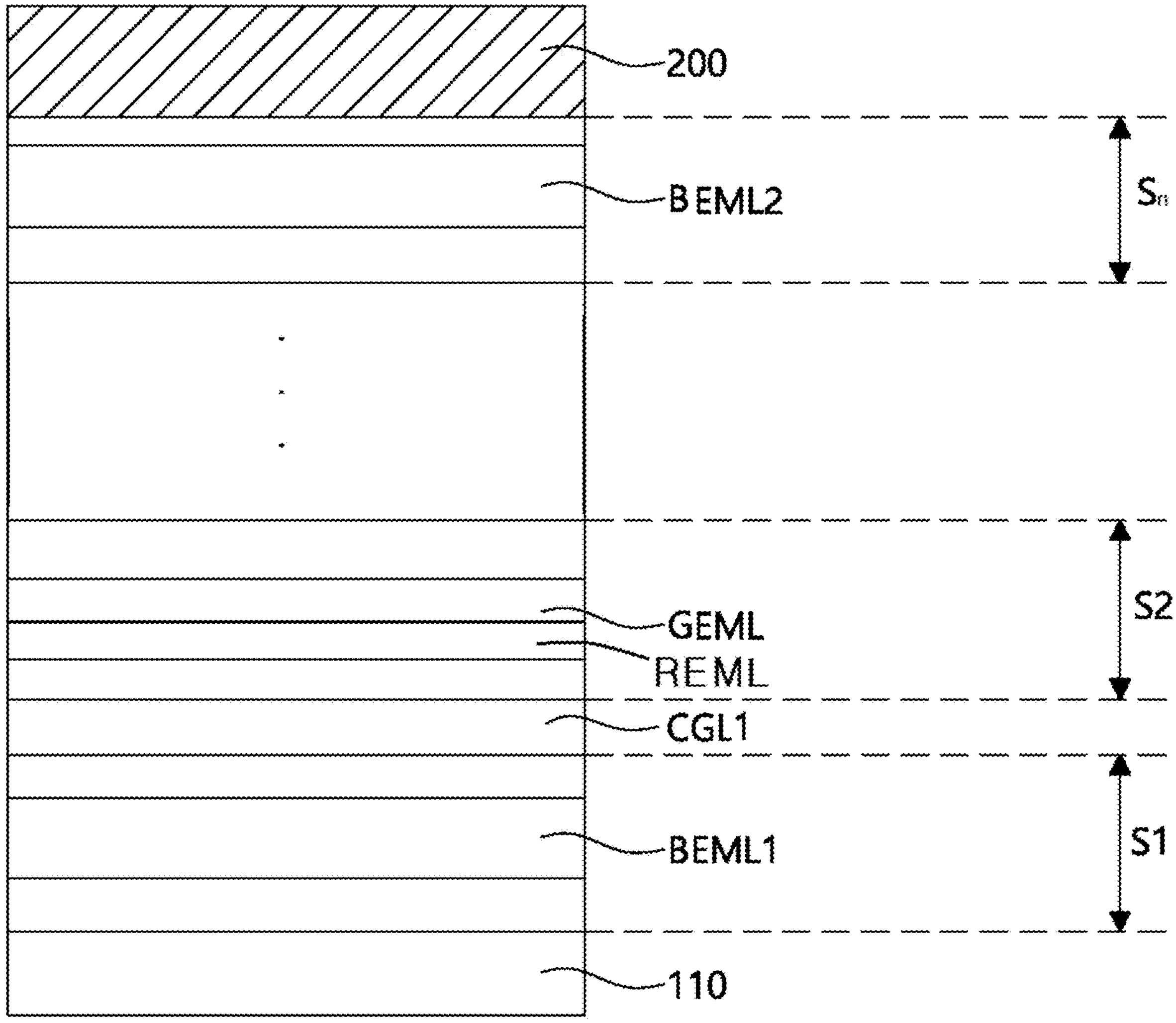
Figure 2:
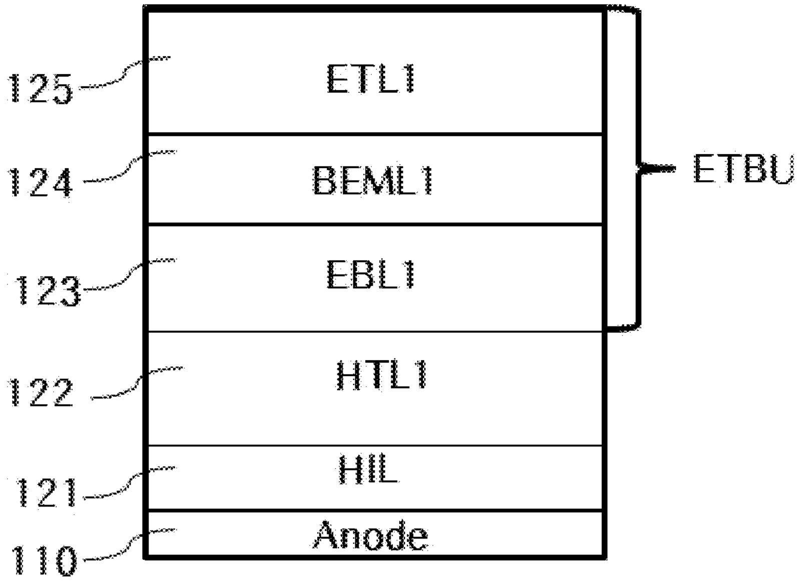
FIG. 2 illustrates a first blue stack according to example embodiments illustrated in FIGS. 1A and 1B.

FIGS. 1A and 1B each illustrates a schematic cross-sectional view of a light emitting device according to an example embodiment of the present disclosure. FIG. 2 illustrates a first blue stack according to example embodiments illustrated in FIGS. 1A and 1B.

As illustrated in the example embodiments of FIGS. 1A and 1B, the light emitting device according to an example embodiment of the present disclosure includes an anode 110 and a cathode 200 facing each other, a first stack S1 and a second stack S2 disposed between the anode 110 and the cathode 200, and a first charge generation layer CGL1 disposed between the first stack S1 and the second stack S2, wherein the first stack S1 includes a first blue light emitting layer BEML1 and the second stack S2 includes at least two phosphorescent light emitting layers REML and GEML, each emitting light having a longer wavelength than that of the light emitted by the first blue light emitting layer BEML1.

FIG. 1A illustrates a light emitting device including a configuration having two stacks according to an example embodiment of the present disclosure. FIG. 1B illustrates a light emitting device including a configuration having three or more stacks (in which n in the example embodiment of FIG. 1B is a natural number of 3 or more) according to another example embodiment of the present disclosure. The example embodiment of the light emitting device illustrated in the example embodiment of FIG. 1B further includes, in addition to the first stack S1 and the second stack S2 including the phosphorescent light emitting layer, a stack including a second blue light emitting layer BEML2 that emits blue light.

As illustrated in the example embodiment of FIG. 1A, a first common layer CML1 relating to hole transport and injection is disposed between the first blue light emitting layer BEML1 of the first stack S1 and the anode 110. A second common layer CML2 relating to electron transport is disposed between the first blue light emitting layer BEML1 and the first charge generation layer CGL1. Similarly, a third common layer CML3 relating to hole transport is disposed between the red light emitting layer REML of the second stack S2 and the first charge generation layer CGL1. A fourth common layer CML4 relating to electron transport is disposed between the green light emitting layer GEML and the cathode 200.

As illustrated in the example embodiment of FIG. 2, the first stack S1 emitting blue light includes a hole injection layer 121, a first hole transport layer 122, a first electron-blocking layer 123, a blue light emitting layer 124, and a first electron transport layer 125 on the anode 110.

Here, the hole injection layer 121 is a layer that is initially formed before holes are injected from the anode 110. The hole injection layer 121 may function to lower an energy barrier to inject holes from an electrode component into an organic material. The hole transport material including an aryl group or an arylene group may include a p-type dopant. The p-type dopant may be an organic material having a very low HOMO level, such as HATCN, or an inorganic compound containing a metal and fluoride, such as $MgF_2$.

The first hole transport layer 122 may be selected from organic materials having excellent hole transport properties so that holes injected through the hole injection layer are transferred to the first blue light emitting layer 124. The first hole transport layer 122 may confine holes to the first blue light emitting layer 124. The first hole transport layer 122 may be formed of an organic material or a mixture of a plurality of organic materials to perform a hole transport function.

The first blue light emitting layer 124 may include a first host and a boron-based dopant having an emission peak of 430 nm to 480 nm. The first host may be a material capable of easily transferring energy to the boron-based dopant and smoothly inducing excitation in the boron-based dopant. The first host may be selected from a material that may have electron transport capability, for example, an organic material having an anthracene as a core.

In addition, the first electron transport layer 125 may be formed of or contain at least one material that may have high electron transport efficiency, for example, a first material represented by the following Formula 1, to confine electrons to the first blue light emitting layer 124.

[Formula 1]

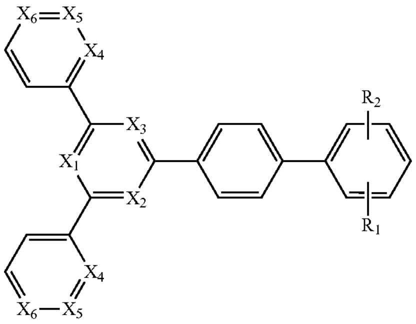

Here, $R_1$ and $R_2$ are each independently selected from a cycloalkyl group, an aryl group and a heteroaryl group. The heteroaryl group may include an unsubstituted or aryl-substituted carbazole group.

$X_1$, $X_2$, and $X_3$ are each independently N or CH. One of $X_4$, $X_5$, and $X_6$ is N, and the remaining ones are CH. In the Formula 1, the two phenyl rings containing $X_4$, $X_5$, and $X_6$ may be symmetric relative to the phenyl ring containing $X_1$, $X_2$, and $X_3$.

The first material of Formula 1 constituting the first electron transport layer 125 is bonded to two symmetrical benzene rings. The first material may be capable of transferring electrons to the first blue light emitting layer 124 with high efficiency due to the strong electron donor activity of the nitrogen (N) at the end of the symmetrical benzene rings.

In addition, examples of the first material of Formula 1 constituting the first electron transport layer 125 may include at least one of ETM-01 to ETM-60 shown below.

<ETM- 01>

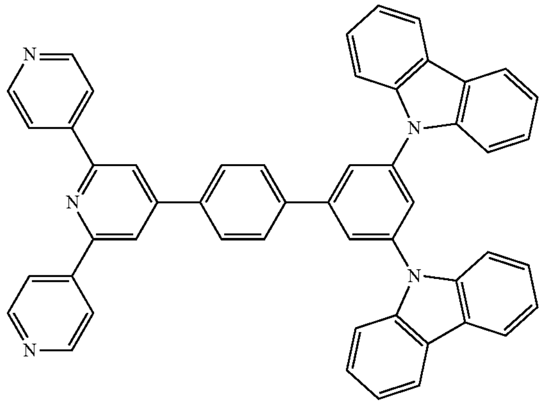

<ETM- 02>

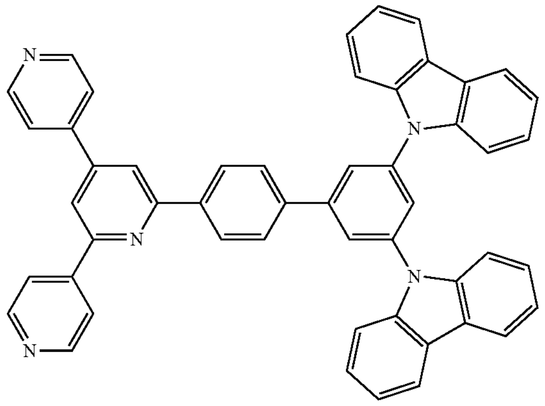

<ETM- 03>

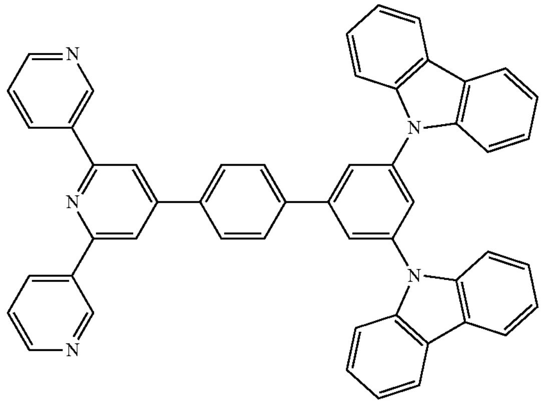

-continued
<ETM- 04>
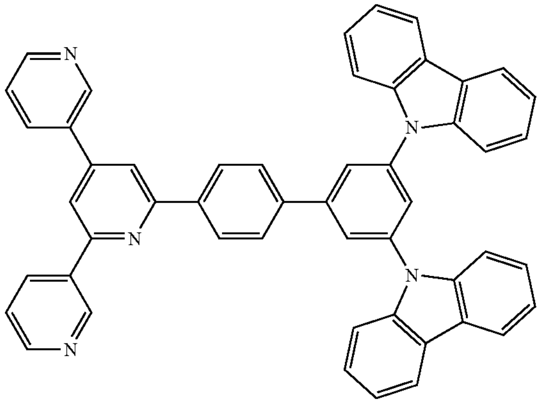
<ETM- 05>
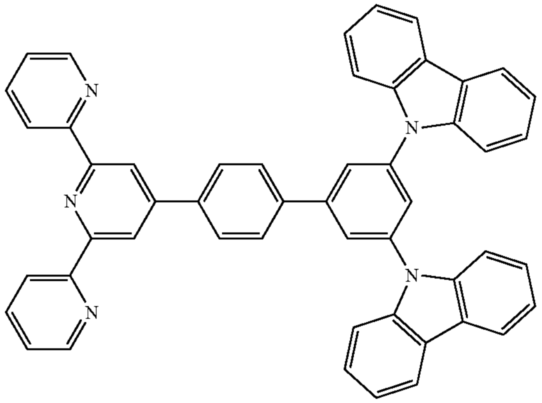
<ETM- 06>
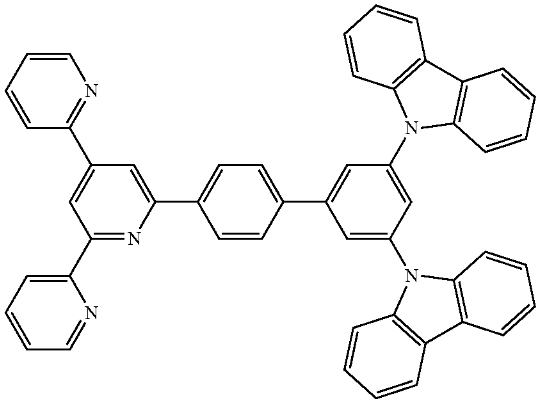
-continued
<ETM- 07>
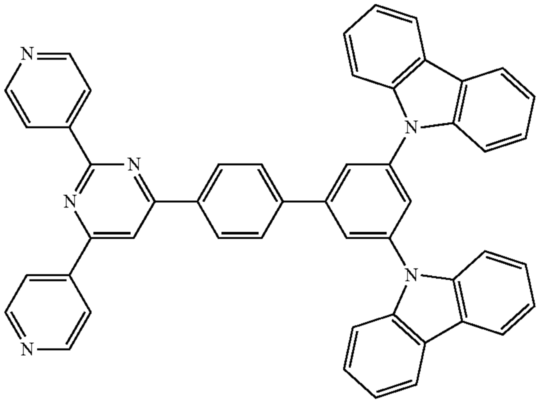
<ETM- 08>
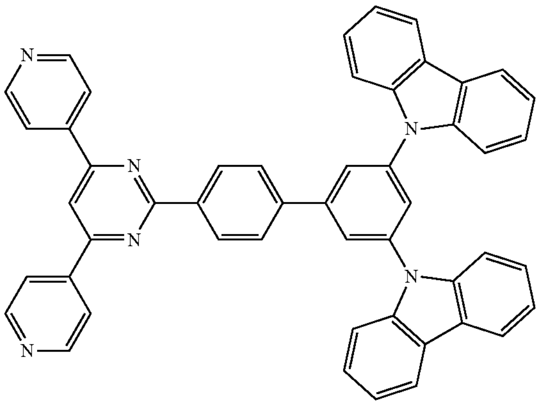
<ETM- 09>
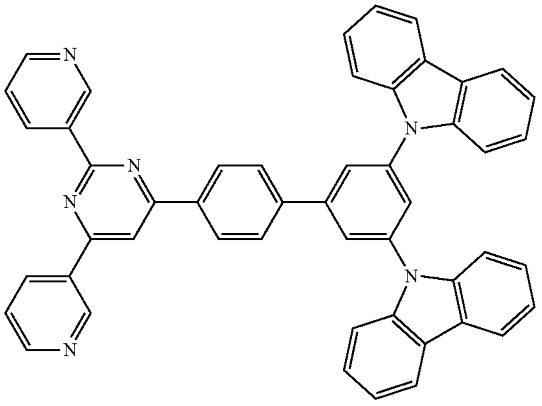

-continued
<ETM- 10>
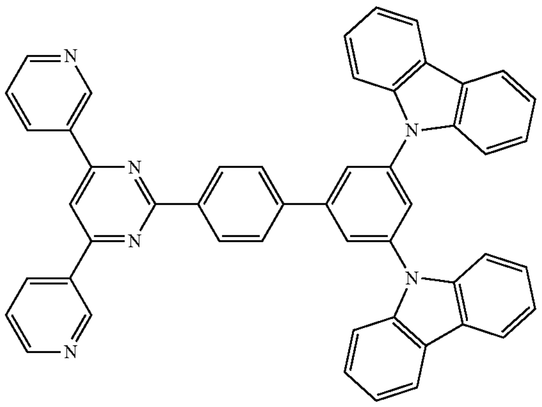
<ETM- 11>
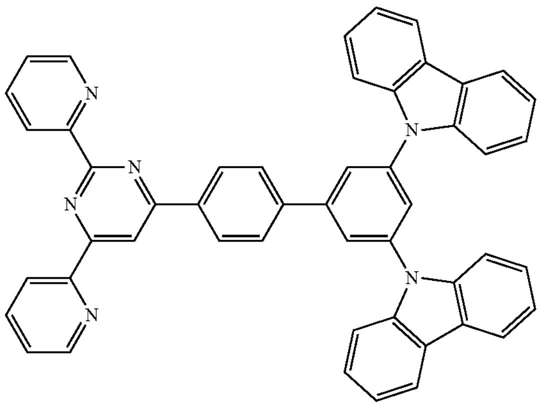
<ETM- 12>
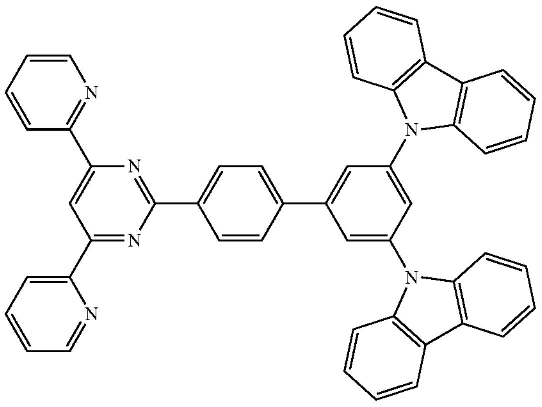
<ETM- 13>
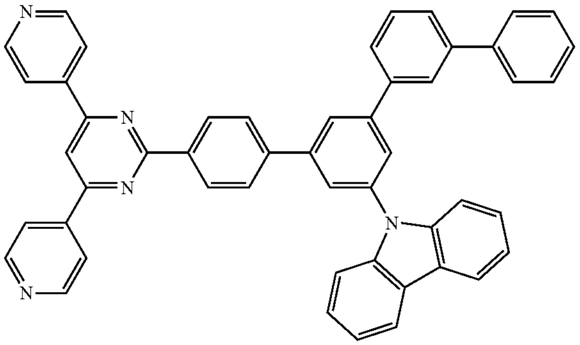
-continued
<ETM- 14>
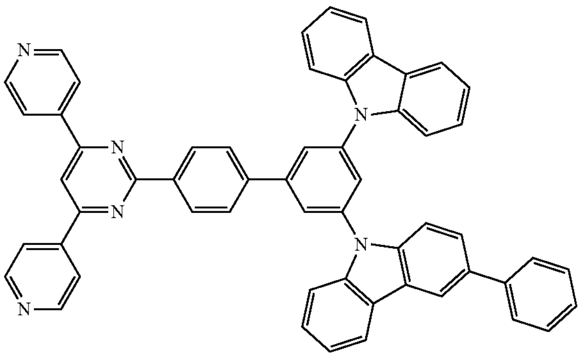
<ETM- 15>
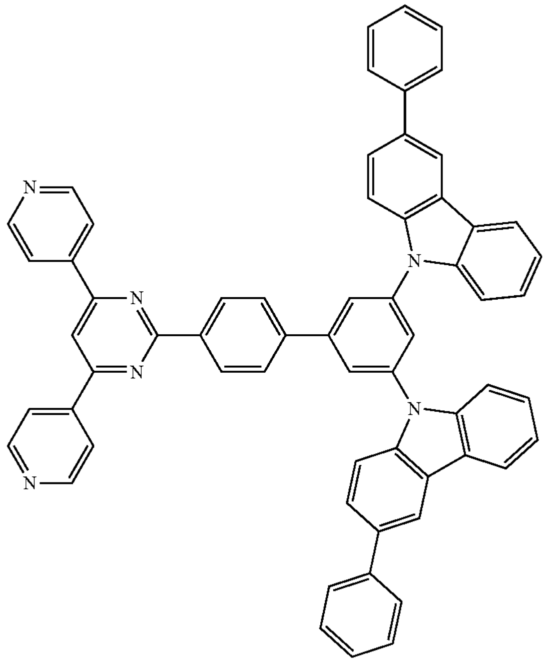
<ETM- 16>
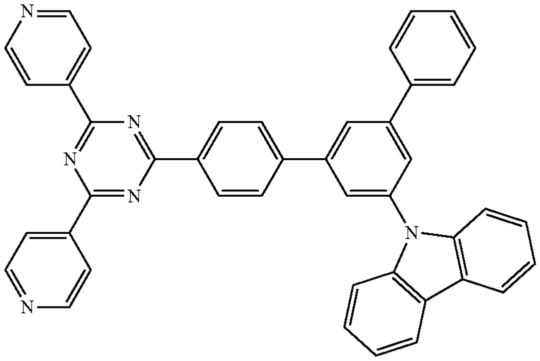

-continued
<ETM- 17>
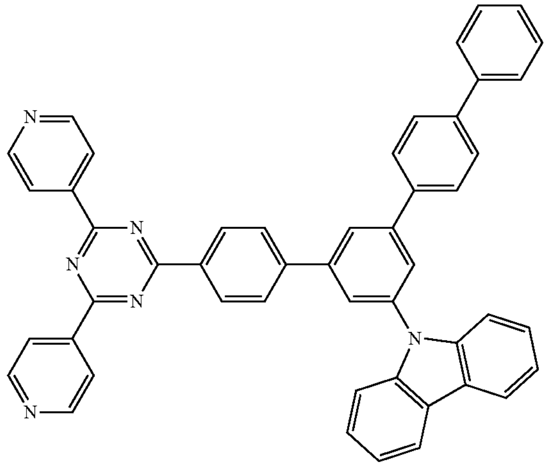
<ETM- 18>
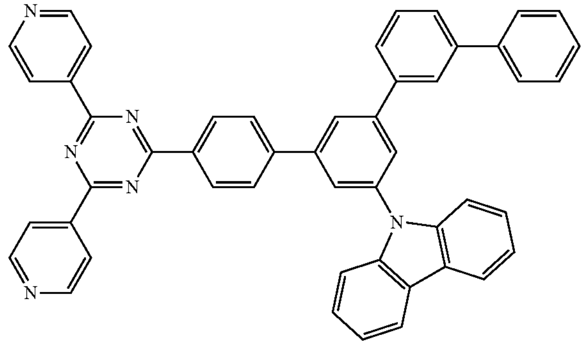
<ETM- 19>
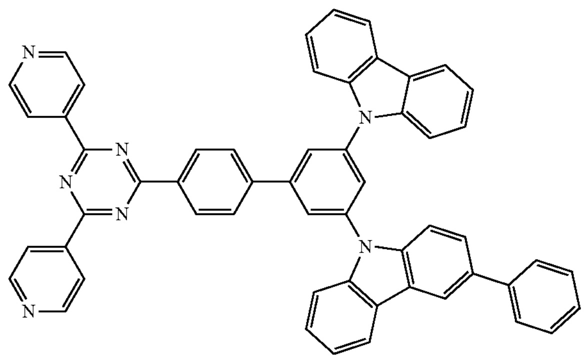
-continued
<ETM- 20>
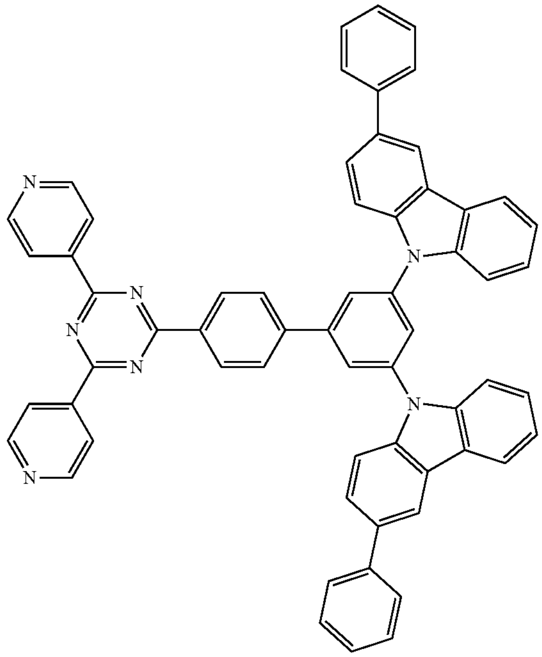
<ETM- 21>
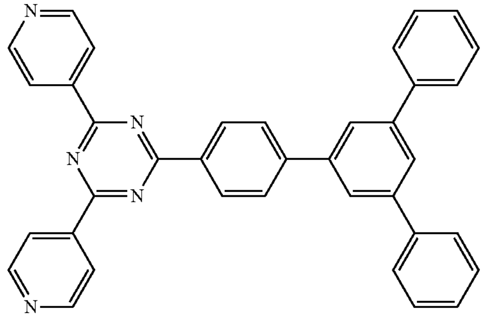
<ETM- 22>
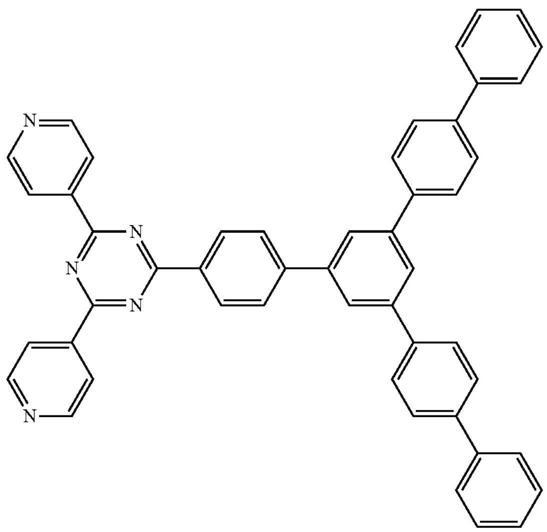

-continued
<ETM- 23>
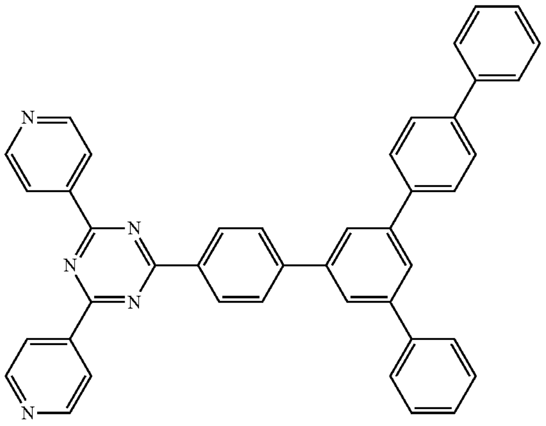
<ETM- 24>
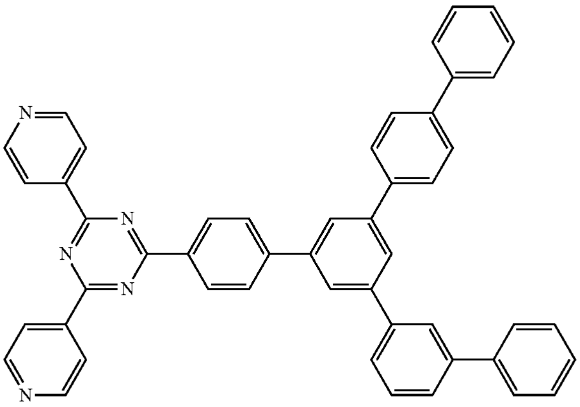
<ETM- 25>
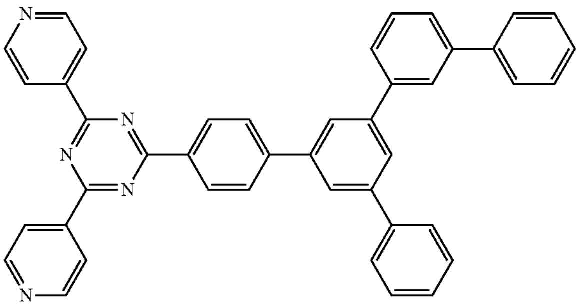
<ETM- 26>
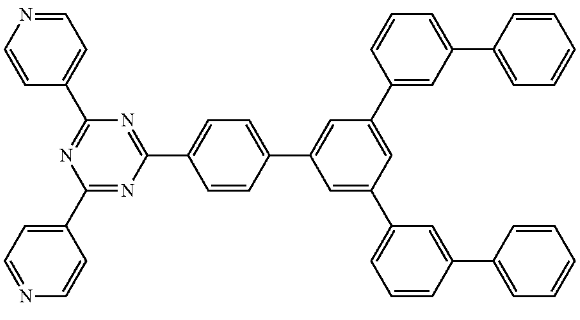
-continued
<ETM- 27>
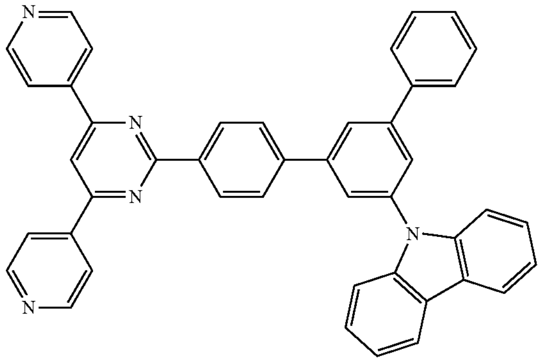
<ETM- 28>
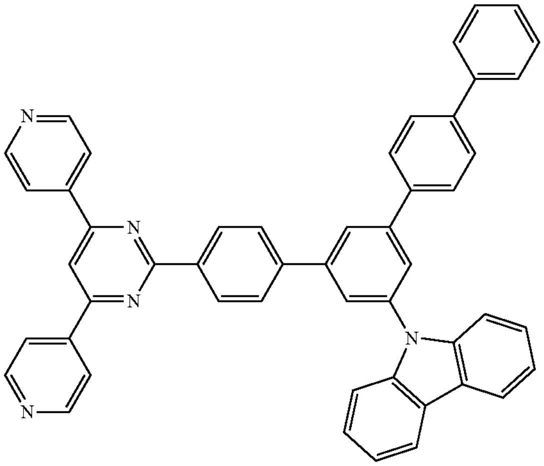
<ETM- 29>
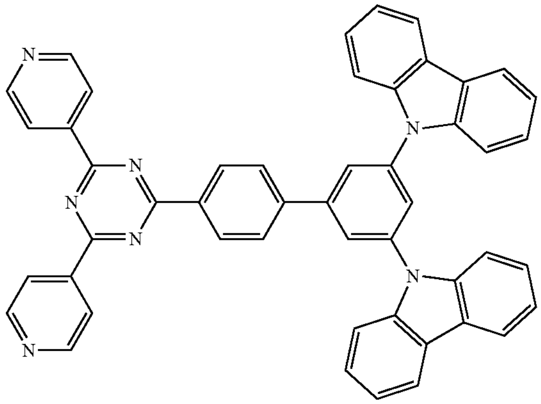

-continued
<ETM- 30>
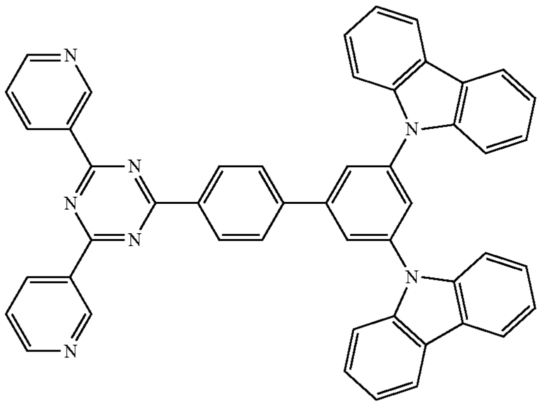
<ETM- 31>
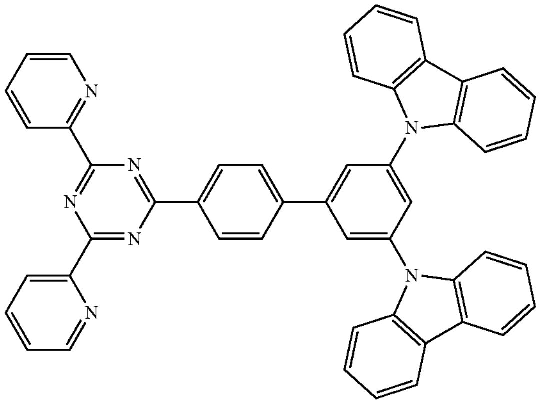
<ETM- 32>
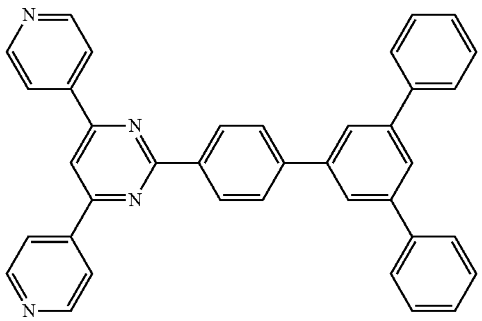
-continued
<ETM- 33>
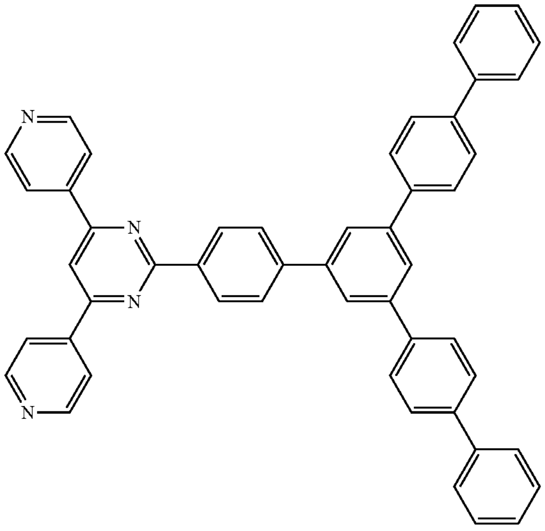
<ETM- 34>
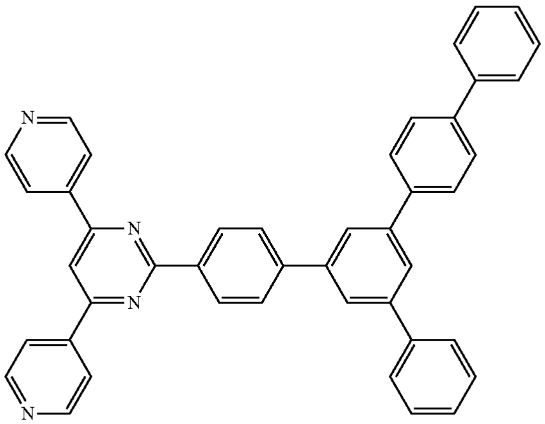
<ETM- 35>
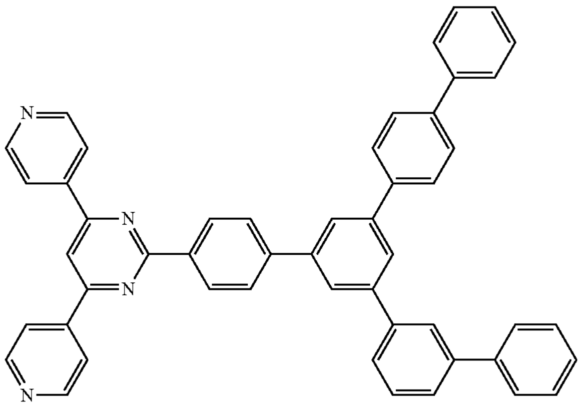

-continued
<ETM- 36>
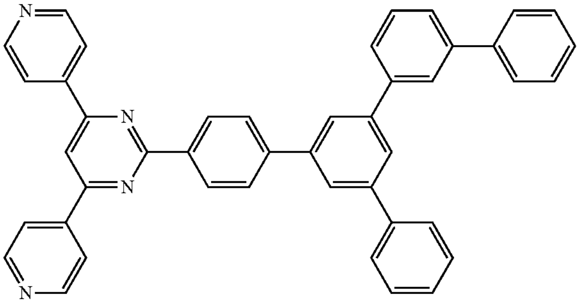
<ETM- 37>
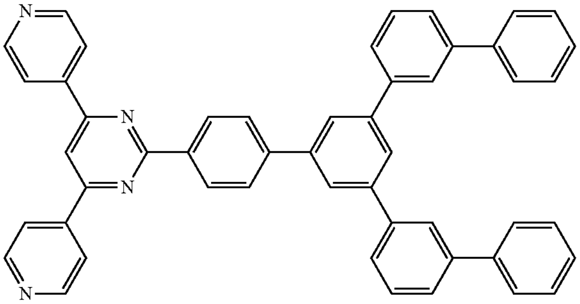
<ETM- 38>
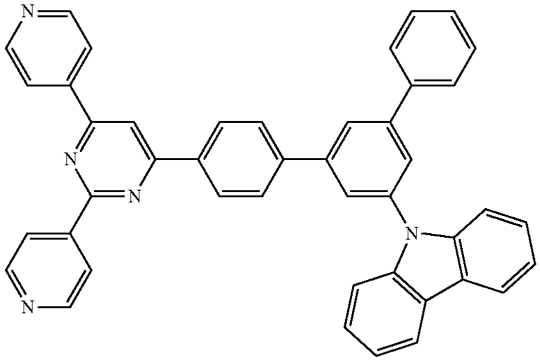
<ETM- 39>
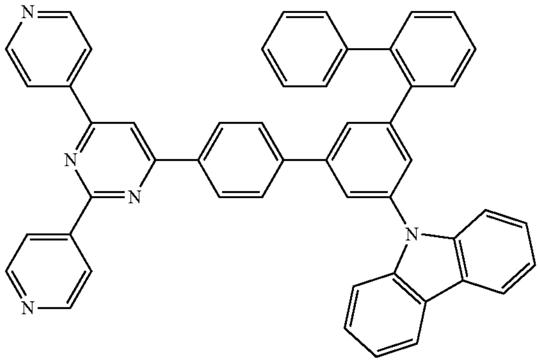
-continued
<ETM- 40>
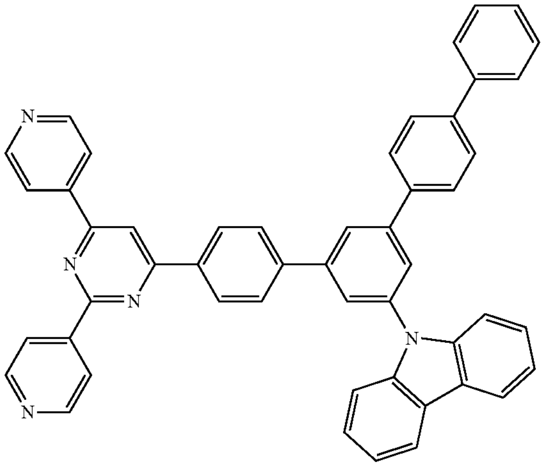
<ETM- 41>
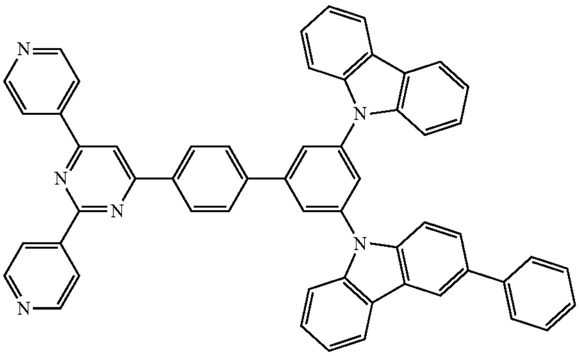
<ETM- 42>
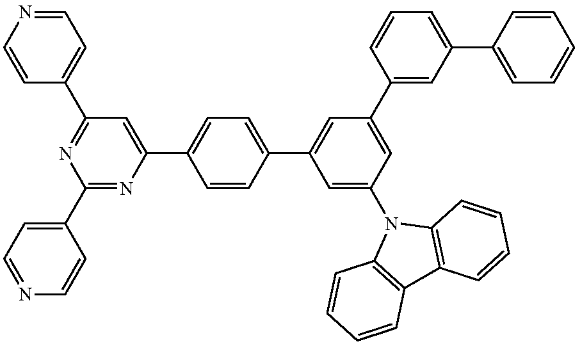

-continued
<ETM- 43>
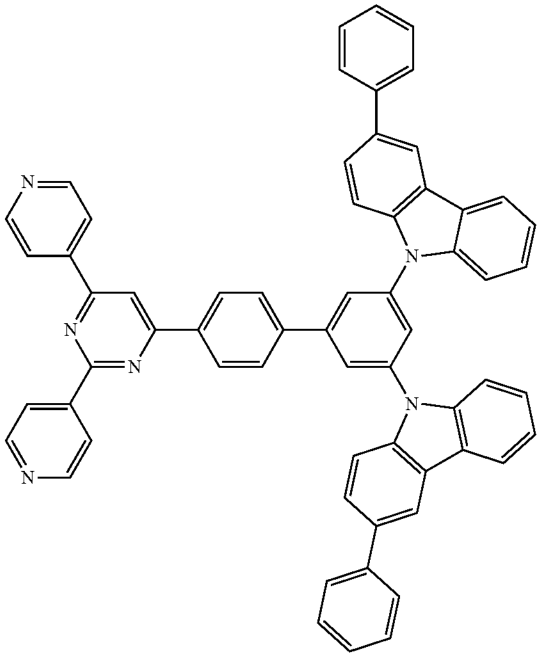
<ETM- 44>
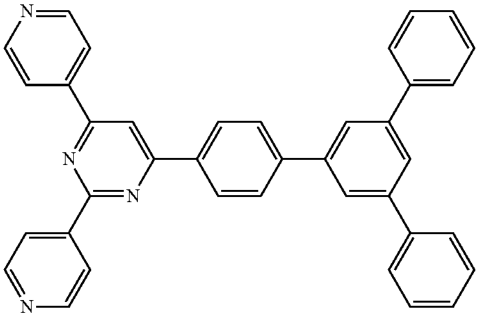
<ETM- 45>
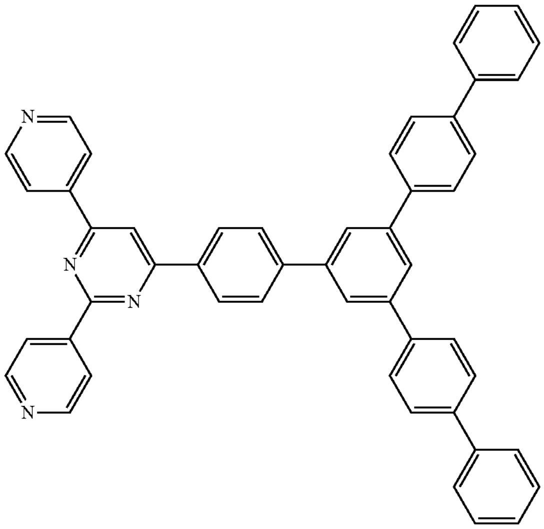
-continued
<ETM- 46>
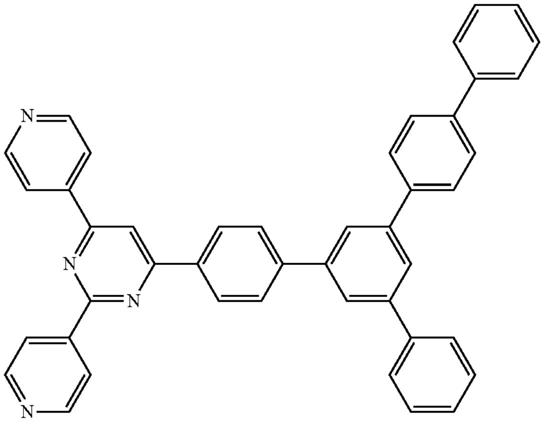
<ETM- 47>
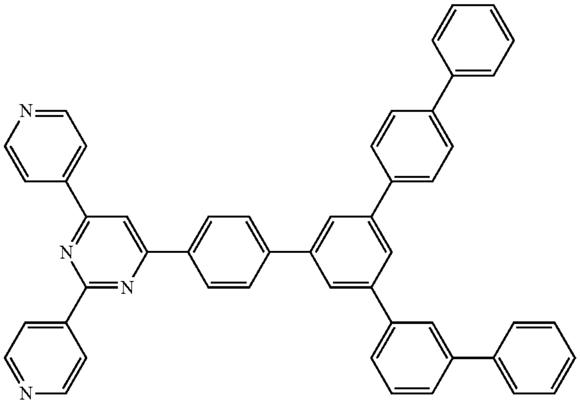
<ETM- 48>
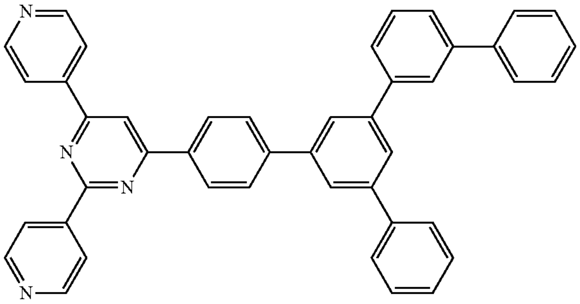
<ETM- 49>
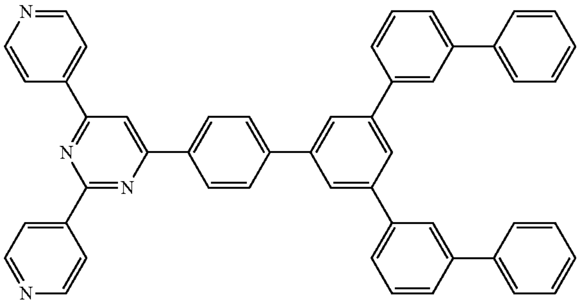

-continued
<ETM- 50>
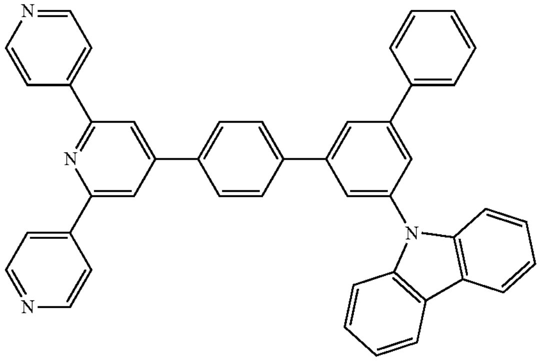
<ETM- 51>
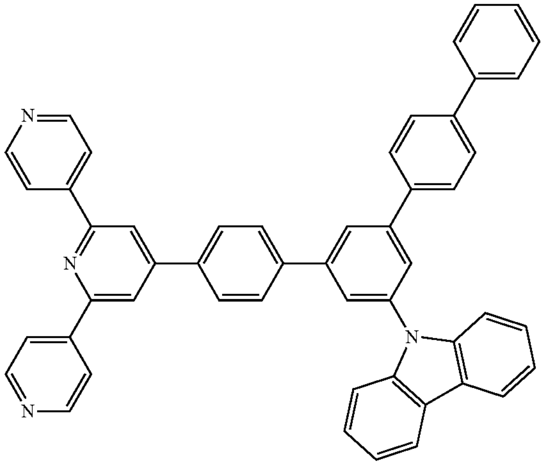
<ETM- 52>
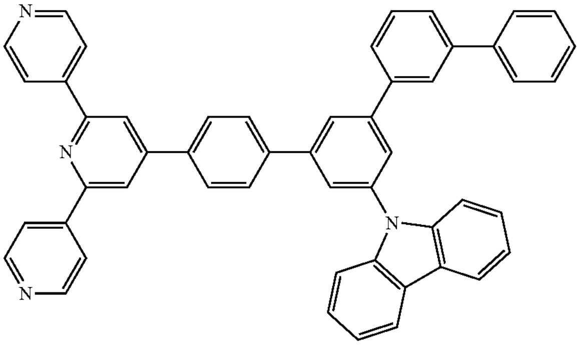
<ETM- 53>
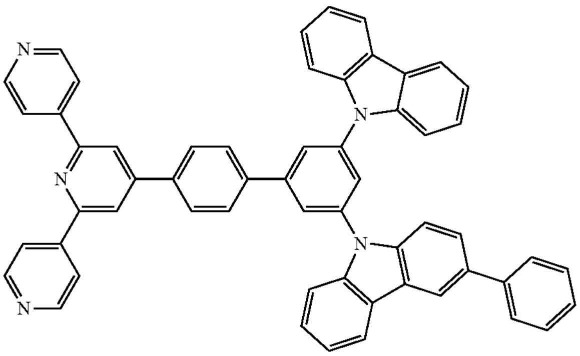
-continued
<ETM- 54>
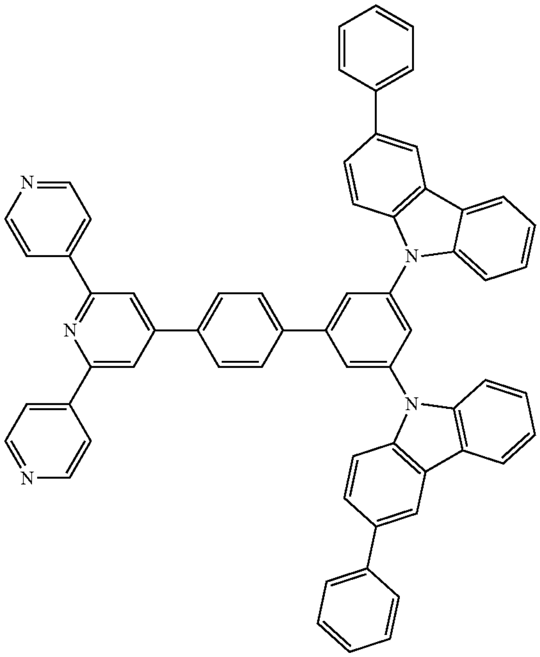
<ETM- 55>
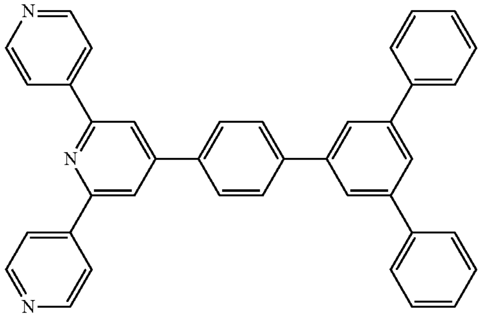
<ETM- 56>
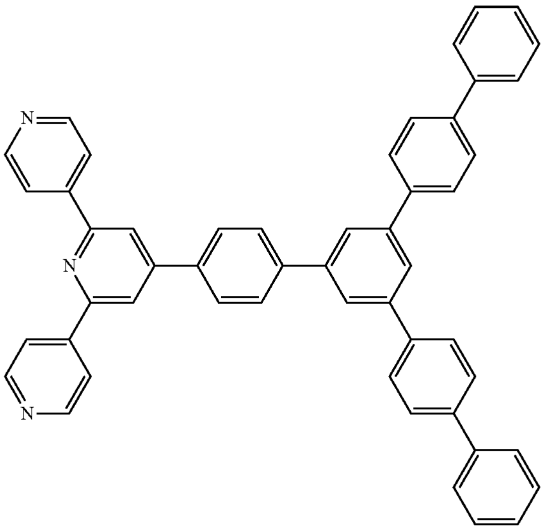

-continued

<ETM- 57>

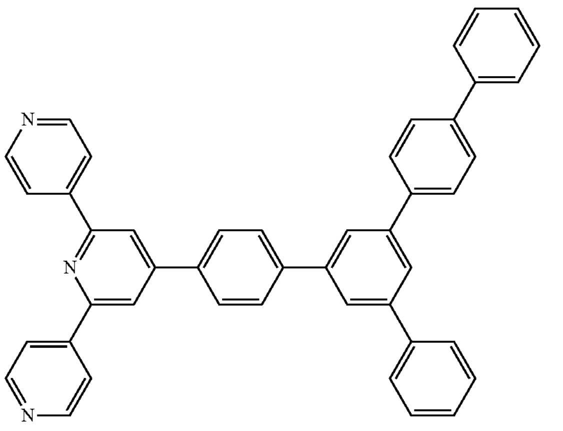

<ETM- 58>

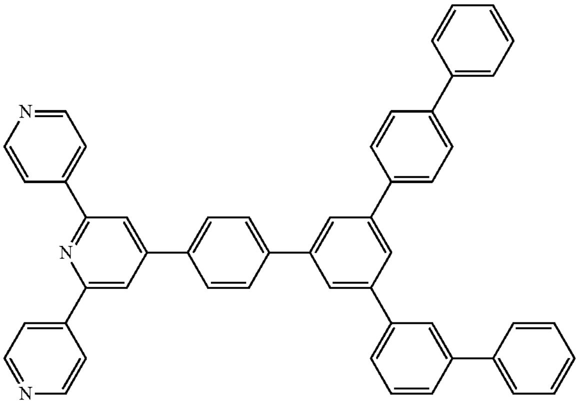

<ETM- 59>

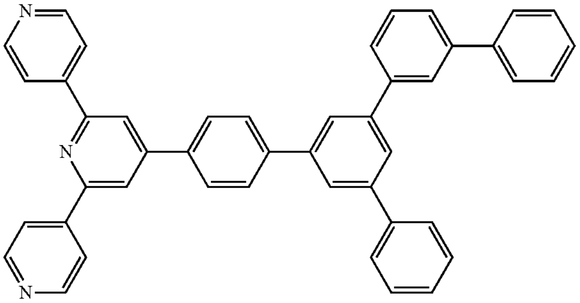

<ETM- 60>

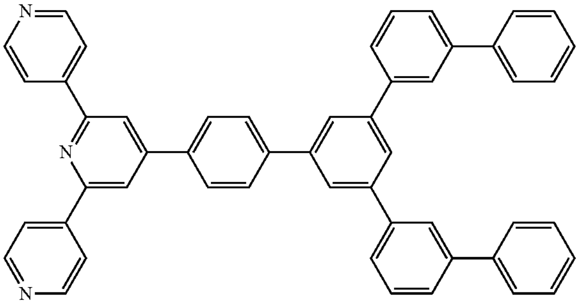

In addition, as a representative material of Formula 1, ETM-01 was obtained through the following preparation method.

(1) Synthesis of First Compound:

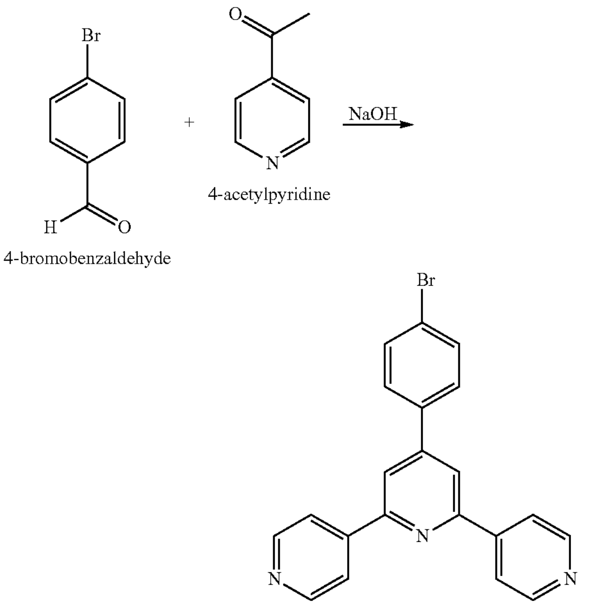

4-bromobenzaldehyde 4-acetylpyridine

First Compound 6.0 g (49.5 mmol) of 4-acetylpyridine and 9.0 g (48.6 mmol) of 4-bromobenzaldehyde were prepared and placed in a flask along with 200 ml of a 2% NaOH aqueous solution, followed by stirring at room temperature for 10 hours and observation of the color change of the reaction solution. Then, 6.0 g (49.5 mmol) of 4-acetylpyridine was added thereto, and an NaOH concentration was set to 20%, followed by stirring at 80° C. for 8 hours. The product was dehydrated without purification and stirred under reflux conditions in a solution containing more than 36.0 g of ammonium acetate in 500 mL of ethanol for 5 hours. Then, the product was recrystallized from the resulting reaction solution using ethanol to obtain the first compound (11 g, 60%).

(2) Synthesis of Second Compound:

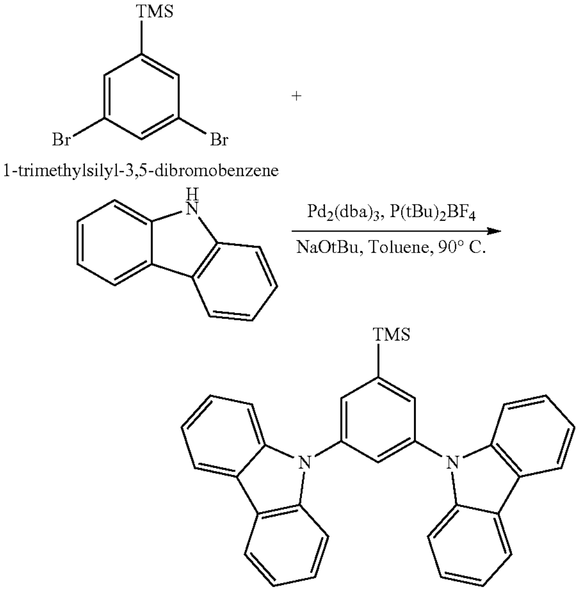

1-trimethylsilyl-3,5-dibromobenzene 8.1 g (48.75 mmol) of Carbazole, 6.0 g (19.5 mmol) of 1-trimethylsilyl-3,5-dibromobenzene, 0.89 g (1.0 mmol) of tris(dibenzylideneacetone)dipalladium(0) ($Pd_2(dba)_3$), 0.59 g (2.0 mmol) of tri-tert-butylphosphine tetrafluoroborate, and 4.7 g (48.8 mmol) of NaOtBu were added to dry toluene (200 mL), followed by stirring at 90° C. for 10 hours. Upon completion of the reaction, the NaOtBu residue was filtered and the product was extracted with ethyl acetate. The resulting product was dehydrated with $MgSO_4$ and purified through column chromatography (hexane:EA=20:1) to obtain a second compound (6.1 g, 65%).

(3) Synthesis of Third Compound:

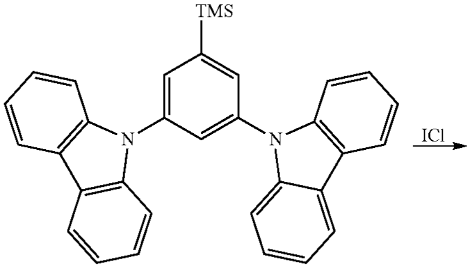

Second Compound

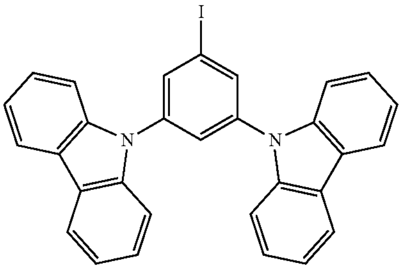

Third Compound

The second compound (4.0 g, 8.3 mmol) was dissolved in $CCl_4$ (70 mL), and an iodine monochloride solution (1.0 M in methylene chloride, 8.3 mL, 8.3 mmol) was added dropwise thereto at 0° C., followed by stirring for 1 hour. Then, the reaction solution was added to a 5 wt % aqueous solution of sodium thiosulfate ($Na_2S_2O_3$), followed by vigorous stirring until the reaction solution became transparent. The reaction solution was extracted with ethyl acetate, dehydrated with $MgSO_4$, and purified through column chromatography (hexane:EA=20:1) to obtain a third compound (3.6 g, 80%).

(4) Synthesis of Fourth Compound:

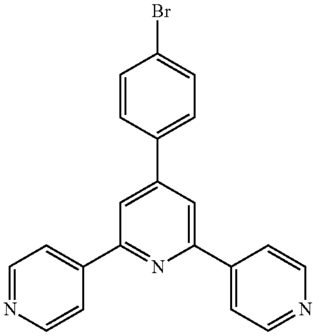

+

First Compound

-continued

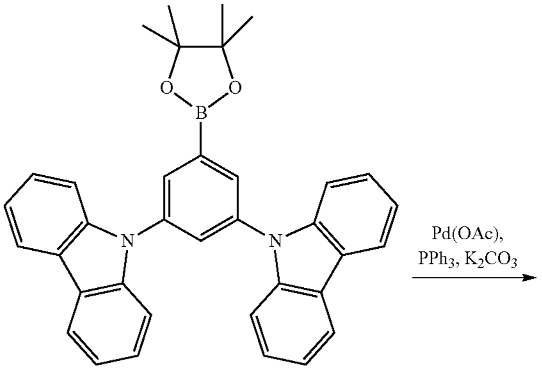

Fourth Compound

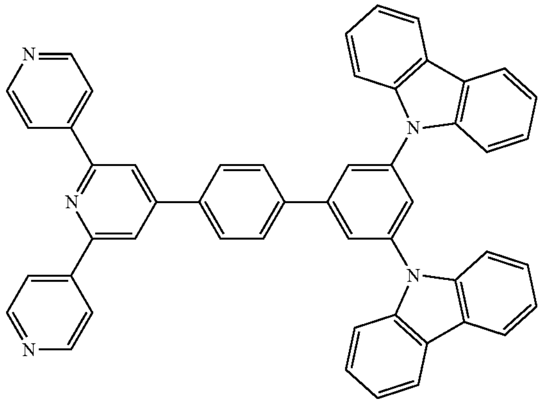

ETM-01

The third compound (3 g, 5.6 mmol), 4,4,4',4',5,5,5',5'-octamethyl-2,2'-bi(1,3,2-dioxaborolane) (2.1 g, 8.4 mmol), [1,1'-bis(diphenylphosphino)ferrocene]dichloropalladium (II) ($Pd(dppf)Cl_2$) (0.21 g, 0.28 mmol), and potassium acetate (KOAc) (1.65 g, 16.8 mmol) were mixed under an inert atmosphere formed by injection of nitrogen, and then 1,4-dioxane (30 mL) was added thereto, followed by stirring at 130° C. for 12 hours. After completion of the reaction, the mixture was extracted with ethyl acetate, dehydrated with $MgSO_4$, and purified through column chromatography (hexane:EA=7:1 (v/v)) to obtain a fourth compound (2.3 g, 75%).

(5) Synthesis of ETM-01:

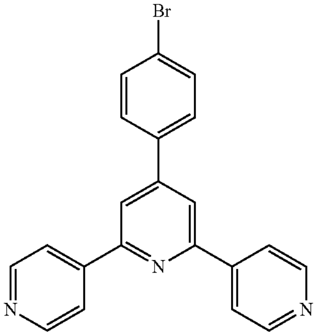

+

First Compound

-continued

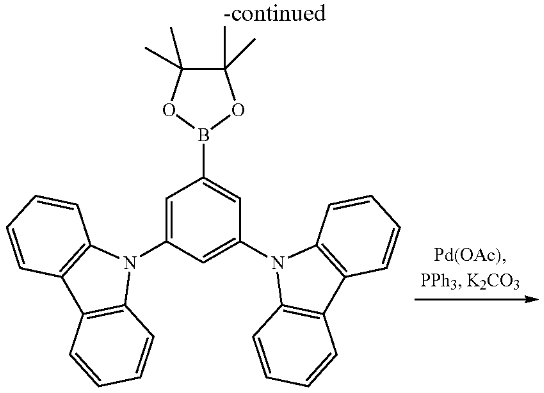

Fourth Compound

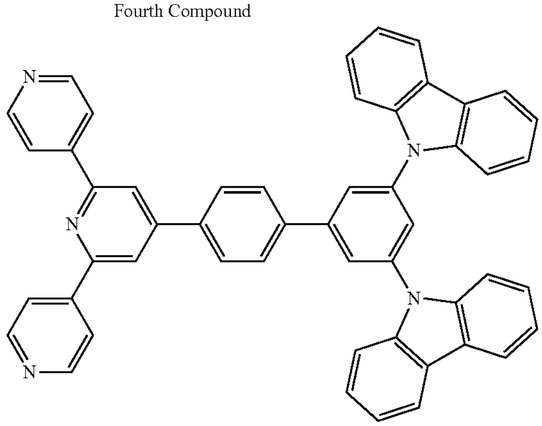

ETM-01

The first compound (1.8 g, 4.6 mmol), the fourth compound (2.3 g, 4.3 mmol), palladium(II) acetate ($Pd(OAc)_2$) (0.048 g, 0.2 mmol), triphenylphosphine ($PPh_3$) (0.28 g, 1.0 mmol), and potassium carbonate ($K_2CO_3$) (3.0 g, 21.5 mmol) were charged into a round-bottom flask in which an inert atmosphere was formed, and degassed THF/$H_2O$ (35 mL/5 mL) was added thereto, followed by stirring at 70° C. for 10 hours. After completion of the reaction, the reaction solution was extracted with dichloromethane, dehydrated with $MgSO_4$, and purified through column chromatography (hexane:EA=7:1 (v/v)) to obtain ETM-01 (2.6 g, 85% yield).

The above synthesis method may be used to synthesize the representative material ETM-01 of Formula 1. ETM-02 to ETM-60 may be obtained by changing the number of nitrogen atoms in the nitrogen-containing precursor in the synthesis of the first compound in (1) and/or by changing the number and/or structure of the synthesized carbazoles and/or phenyl groups in the synthesis of the second compound in (2). For example, for ETM-21, bromobenzene was used instead of carbazole in the synthesis of the second compound in (2).

The light emitting device according to an example embodiment of the present disclosure may include a first electron-blocking layer 123 formed of or include a deuterium-substituted material to prevent or reduce electrons from being rapidly transported from the first electron transport layer 125 to the first blue light emitting layer 124 due to the fast electron transport capacity through the change in the material of the first electron transport layer 125 and then accumulating at the interface between the first blue light emitting layer 124 and the first electron-blocking layer 123.

The first electron-blocking layer 123 may be formed of a second material containing spirofluorene. The first electron-blocking layer 123 may be formed of or include a compound represented by Formula 2 below. The compound represented by Formula 2 has a structure in which spirofluorene moieties opposite each other are bonded and the end group (hydrogen atoms) of the spirofluorene on one side is substituted with deuterium (D).

In the first electron-blocking layer 123, the second material may repel electrons accumulated at the interface between the first electron-blocking layer 123 and the first blue light emitting layer 124 due to the stability of deuterium. The intensity of the light emitted from the first blue light emitting layer 124 may increase. Shortening of the lifespan of the first electron-blocking layer 123 due to accumulated electrons may be prevented or reduced.

[Formula 2]

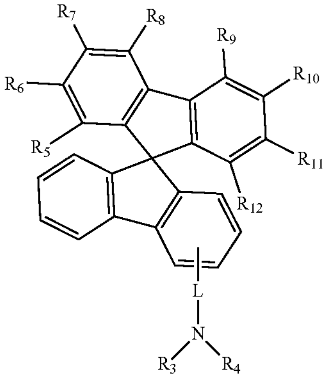

$R_5$ to $R_{12}$ are each a deuterium.

Here, L is a single bond, or is selected from a deuterium-substituted or unsubstituted phenylene group and a deuterium-substituted or unsubstituted naphthylene group.

$R_3$ and $R_4$ are selected from a deuterium-substituted or unsubstituted phenyl group, a deuterium-substituted or unsubstituted biphenyl group, a deuterium-substituted or unsubstituted dimethylfluorene group, a deuterium-substituted or unsubstituted heteroaryl group, a deuterium-substituted or unsubstituted carbazole group, a deuterium-substituted or unsubstituted dibenzofuran group, and a deuterium-substituted or unsubstituted dibenzothiophene group.

Examples of the compound represented by Formula 2 may include EBM-09 to EBM-24 as follows.

<EBM- 09>

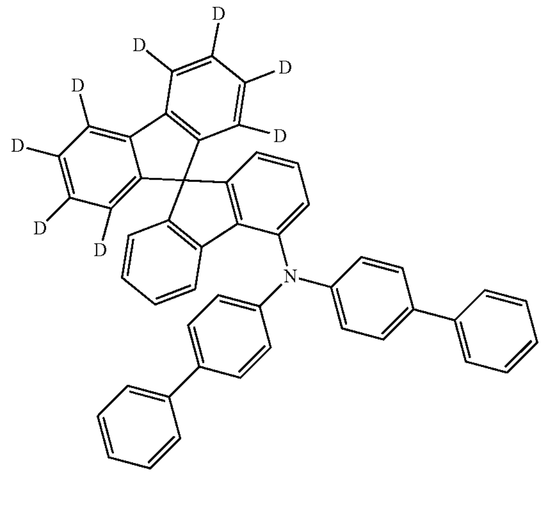

-continued
<EBM- 10>
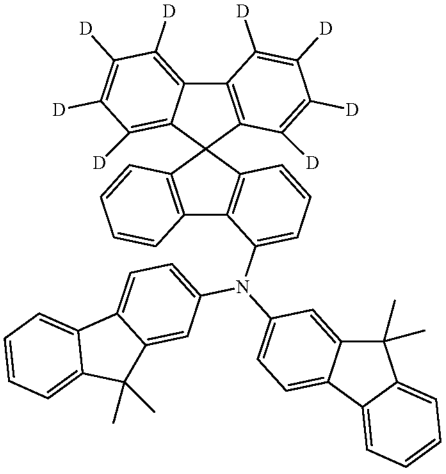
-continued
<EBM- 12>
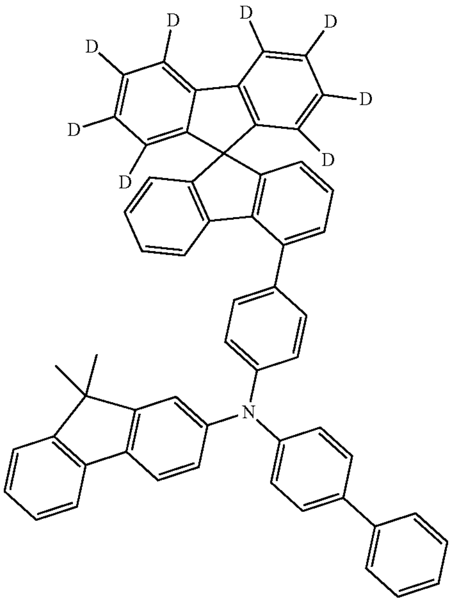
<EBM- 11>
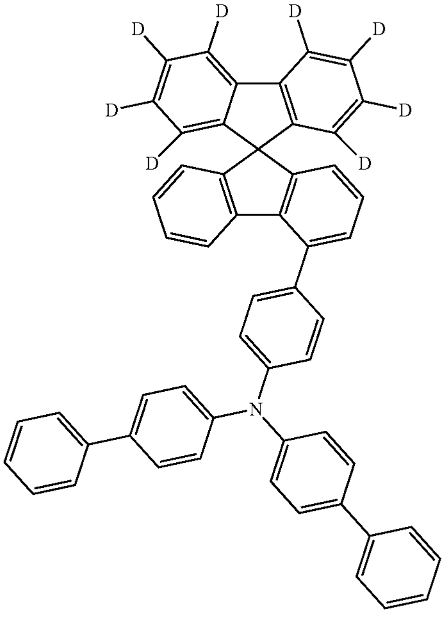
<EBM- 13>
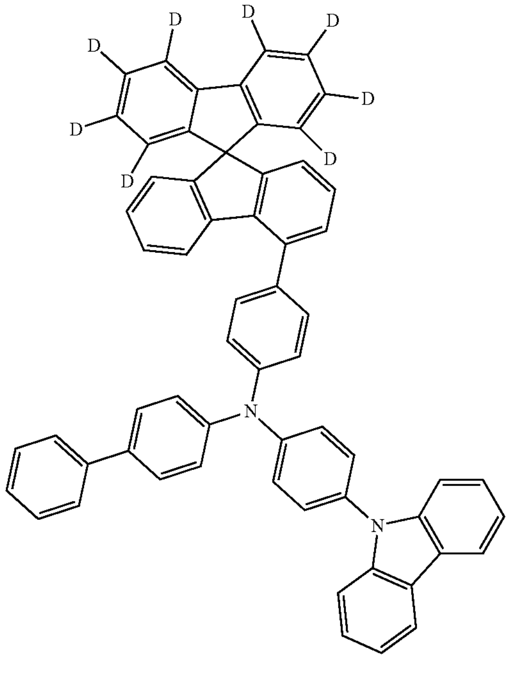

-continued
<EBM- 14>
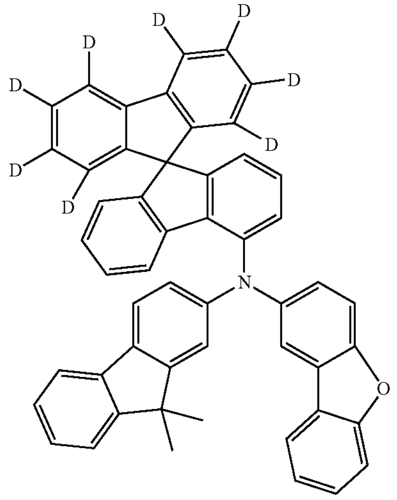
<EBM- 15>
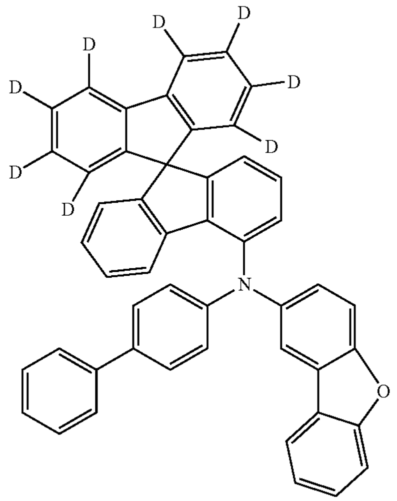
<EBM- 16>
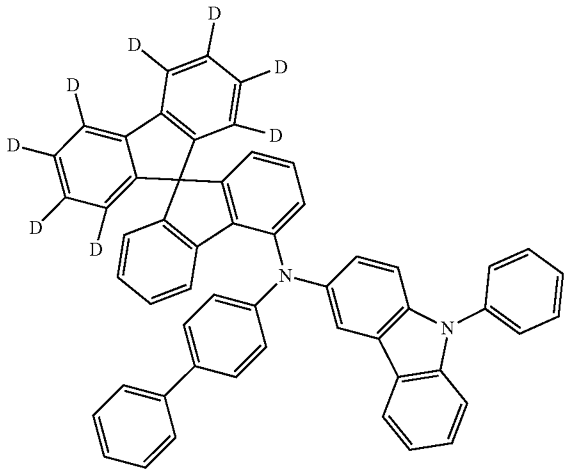
-continued
<EBM- 17>
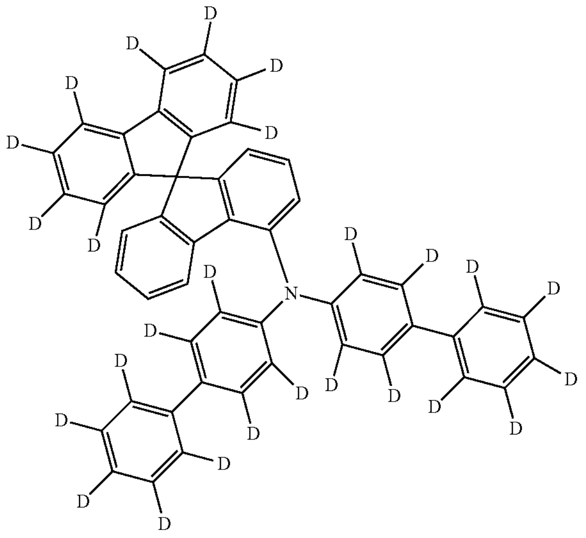
<EBM- 18>
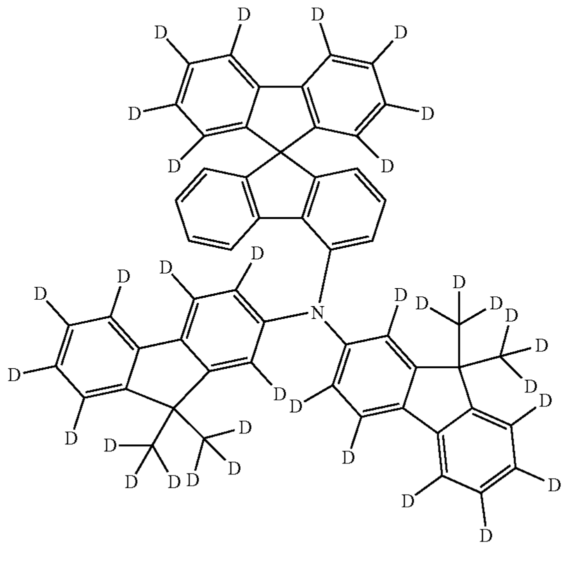

-continued
<EBM- 19>
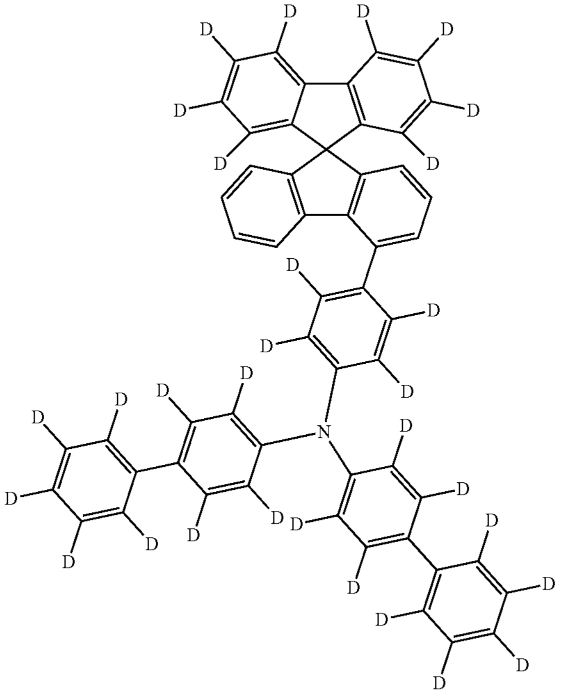
<EBM- 20>
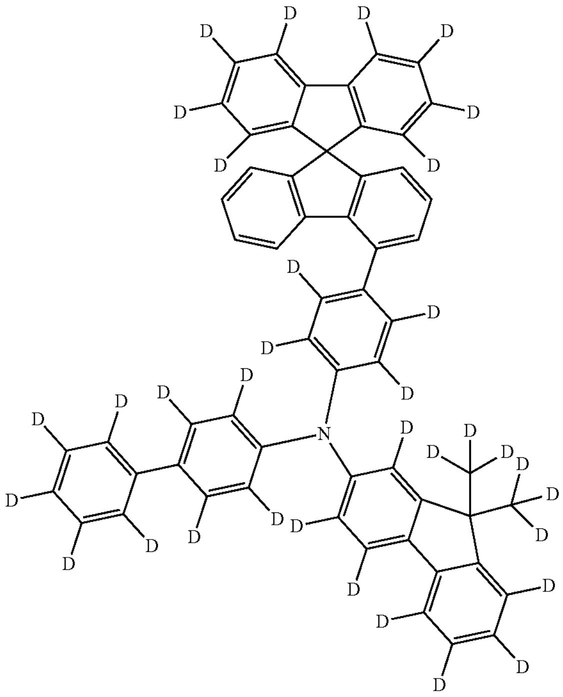
-continued
<EBM- 21>
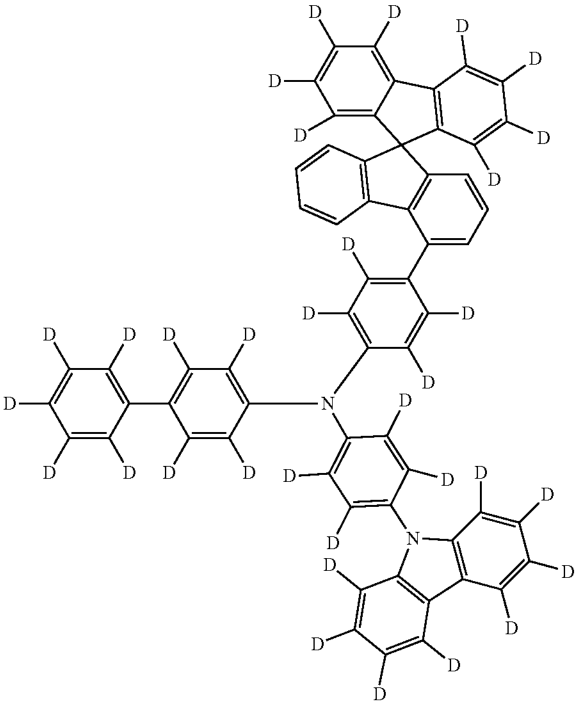
<EBM- 22>
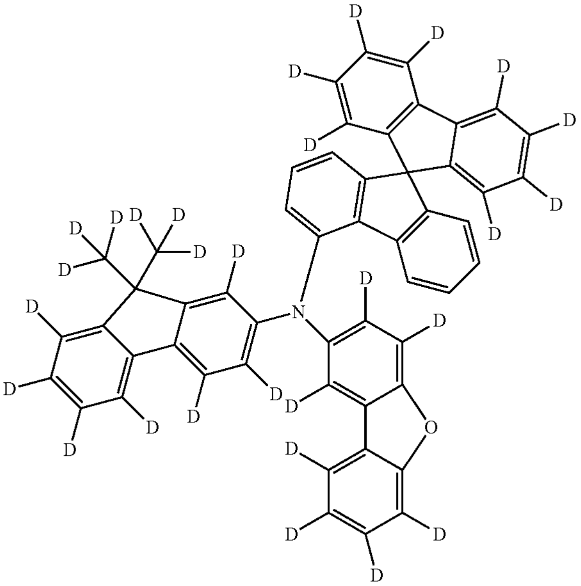

-continued

<EBM- 23>

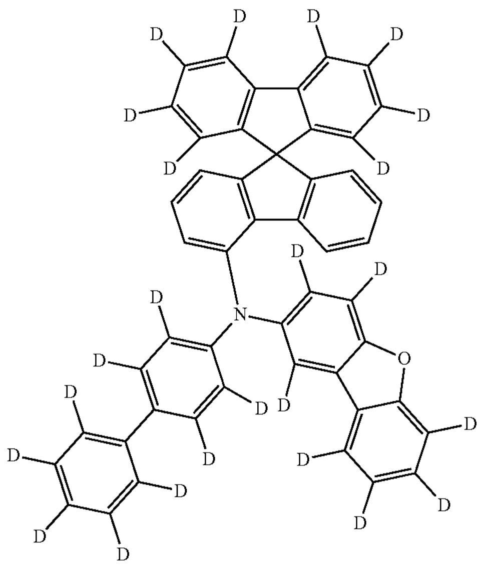

<EBM- 24>

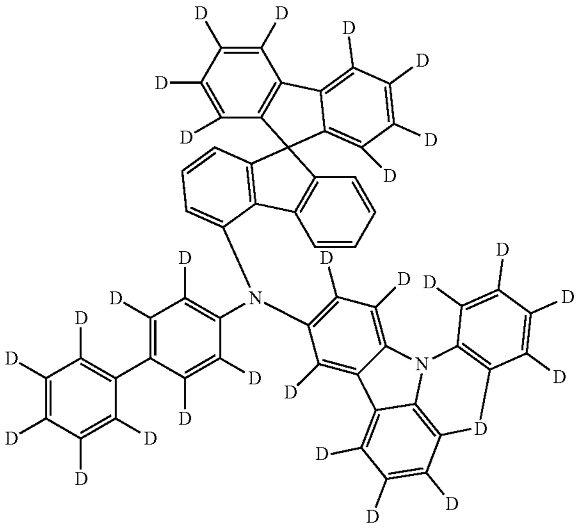

Here, the first electron-blocking layer 123, the first blue light emitting layer 124, and the first electron transport layer 125, which are layers relating to the confinement of electrons to the first blue light emitting layer, are referred to as an "electron transport and blocking unit (ETBU)".

The light emitting device may further include a first charge generation layer CGL1 to supply electrons and holes to the first stack S1 and the second stack S2 between the first stack S1 and the next stack, far from the cathode 200 and the anode 110, respectively. The first charge generation layer CGL1 may include an n-type charge generation layer, which generates electrons and supplies the generated electrons to the first electron transport layer 125 of the first stack S1, and a p-type charge generation layer, which generates holes and supplies the holes to the hole transport layer of the second stack S2.

As illustrated in the example embodiment of FIG. 1A, when the light emitting device has a two-stack structure, in consideration of the viewing angle characteristics, the first stack S1 close to the anode 110 is formed as a blue fluorescent stack including a first blue light emitting layer BEML1 124 having the ability to emit fluorescent light. The second stack S2 is formed as a phosphorescent light emitting stack including at least a phosphorescent red light emitting layer and a phosphorescent green light emitting layer.

The phosphorescent light emitting layer used in the second stack S2 is, for example, a red light emitting layer or a green light emitting layer. The long-wavelength phosphorescent materials therefor are known to be improved with regard to both lifetime and efficiency.

Theoretically, the phosphorescent light emitting layer may have an internal quantum efficiency of 100%. The fluorescent light emitting layer may have an internal quantum efficiency of 25%. A reason for including a phosphorescent stack as the second stack S2 may be that the fluorescent light emitting stack may have an internal quantum efficiency as low as 25% such that when white is realized using a minimum number of stacks, there may be an increase in the driving voltage. If all of the light emitting stacks are fluorescent light emitting stacks, efficiency may be very low when using a fixed number of stacks.

In the light emitting device according to an example embodiment of the present disclosure, the efficiency of blue fluorescent light emission from the first blue light emitting layers (BEML1, 124) may be improved by changing the material of the first electron transport layer 125 in the electron transport and blocking unit ETBU in the first stack S1. In this embodiment, when the efficiency of the light emitting layer is improved in the first blue light emitting layer 124, the contribution of triplet-triplet annihilation (TTA), which is the main mechanism for improving efficiency, may be greatly increased. The materials for the first electron-blocking layer 123 may be substituted with deuterium to prevent or reduce a phenomenon in which triplet excitons or electrons may inhibit the action of other light emitting materials in the first blue light emitting layer 124 or move toward the interface of the first electron-blocking layer 123 to shorten the lifespan.

The light emitting device according to an example embodiment of the present disclosure may overcome the trade-off relationship between blue efficiency and lifespan in a blue light emitting stack. The electron transport layer includes a material that may have greatly improved electron transport capability. The electron-blocking layer, which may be mainly degraded by TTA, may include a material that is substituted with deuterium to improve efficiency and prevent or reduce shortening of the lifespan. Thus, the lifespan of the blue fluorescent material may be maintained.

As illustrated in the example embodiment of FIG. 1B, when the light emitting device further includes a stack emitting blue light, in addition to the second stack S2, it may further include an electron transport and blocking unit, in addition to an additional blue light emitting stack BS. The electron transport and blocking unit may include, as a layer that may be related to confinement of the electrons to the blue light emitting layer, a second electron-blocking layer formed of or include a second material including a compound represented by Formula 2, a blue light emitting layer (BEML2) containing a boron-based dopant having an emission peak of 430 nm to 480 nm, and a second electron transport layer formed of or include a first material represented by Formula 1.

The light emitting device according to an example embodiment of the present disclosure may emit white light through the combination of blue light of the first stack S1 emitted from the internal stack OS, with the long-wavelength light emitted from the phosphorescent light emitting layer of the second stack S2. By forming at least one of the anode 110 and the cathode 200 using a transparent metal or a reflective metal to emit white light, the long-wavelength light emitted from the phosphorescent light emitting layer may be combined with the blue light.

A reason for using the fluorescent blue light emitting layer in the blue light emitting stack in the light emitting device according to an example embodiment of the present disclosure may be that the fluorescent blue light emitting layer may have higher stability than the phosphorescent material in terms of lifespan.

When the charge generation layer adjacent to the second stack (e.g., phosphorescent stack) and the first stack (e.g., fluorescent stack) supplies holes and electrons to the second stack and the first stack at the same or similar level, the blue light emitting efficiency from the first blue light emitting layer may be increased to a level similar to that of the second stack (e.g., phosphorescent stack). Thus, the number of stacks may be reduced. In the light emitting device according to an example embodiment of the present disclosure, the first electron-blocking layer 123 including the second material that includes the compound of Formula 2 may be in contact with one surface of the first blue light emitting layer 124, and the first electron transport layer 125 may be in contact with another surface of the first blue light emitting layer 124. Fast electron transport may be realized through the first material of the first electron transport layer 125. The electrons and excitons may be confined to the first blue light emitting layer 124. Thus, the driving voltage, efficiency, and luminance may be improved without reducing the lifespan. In addition, the efficiency of the blue fluorescent stack and the phosphorescent light emitting stack may be adjusted to similar levels so that the light emitting device according to an example embodiment of the present disclosure may realize white color using only a two-stack structure as illustrated in the example embodiment of FIG. 1A. In this embodiment, it may be possible to reduce the driving voltage to realize the same white color by reducing the number of stacks.

The light emitting device according to an example embodiment of the present disclosure may further include a blue light emitting stack Sn, as illustrated in the example embodiment of FIG. 1B, for high efficiency blue light emission to realize a high color temperature. Accordingly, the light emitting device according to an example embodiment of the present disclosure may include two or more fluorescent blue stacks and a phosphorescent stack emitting light having a wavelength different from that of the light emitted by the fluorescent blue stack.

In some embodiments, the efficiency of the blue light emitting stack may be sufficiently improved, and a white light emitting device may realize blue using only one blue light emitting stack, as illustrated in the example embodiment of FIG. 1A. Even if the white light emitting device includes only one blue light emitting stack and one phosphorescent emitting stack, efficiency may be improved. A reduction in the driving voltage may be decreased.

Changes in efficiency and lifespan depending on the constituents of an electron-blocking layer and an electron transport layer in a blue light emitting device emitting blue light were investigated in experiments. In the experimental example, a single blue fluorescent stack was provided between the anode and the cathode.

The following electron-blocking materials, EBM-01 to EBM-08, contain spirofluorene that is not substituted with deuterium. The material for the electron-blocking layer used in the first experimental example group (Ex1-1 to Ex1-72) was spirofluorene that was not substituted with deuterium.

<EBM- 01>

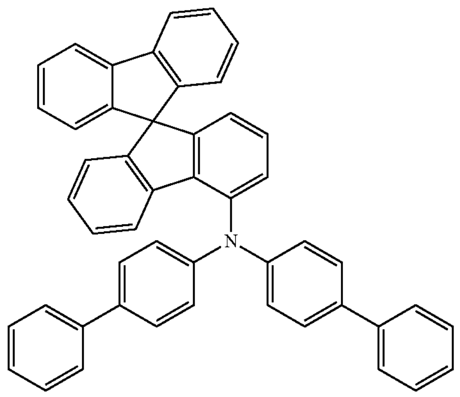

<EBM- 02>

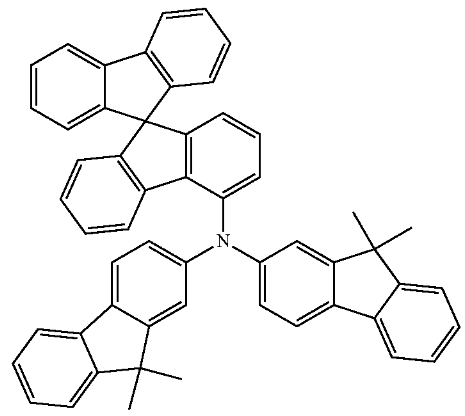

<EBM- 03>

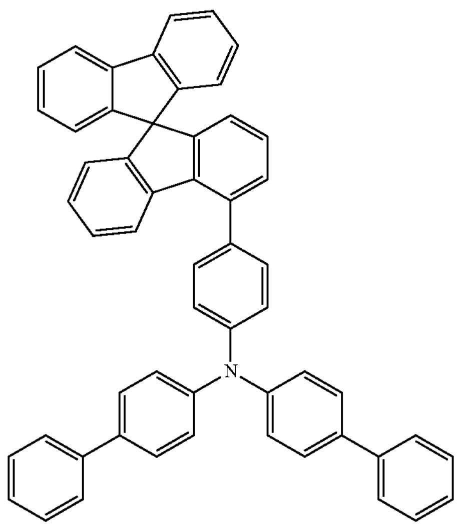

-continued

<EBM- 04>

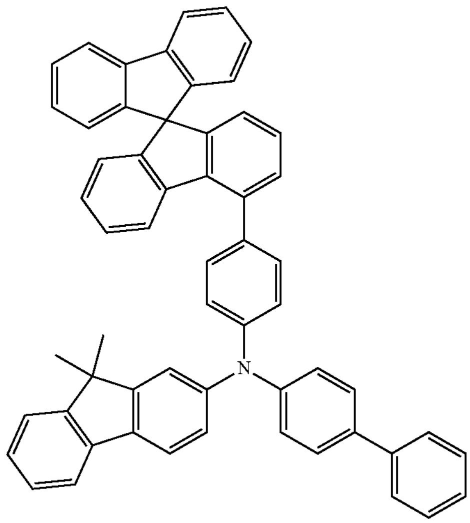

<EBM- 05>

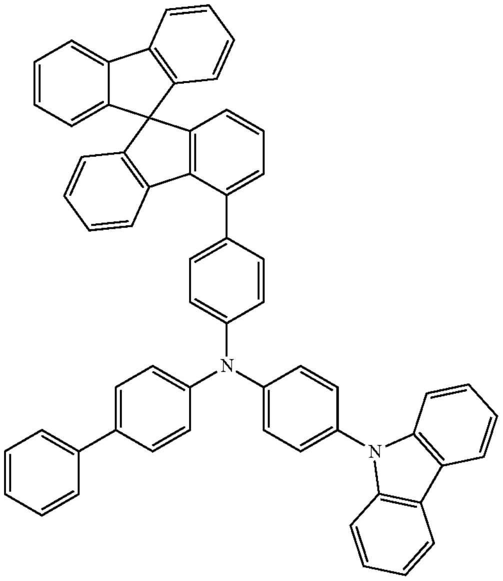

<EBM- 06>

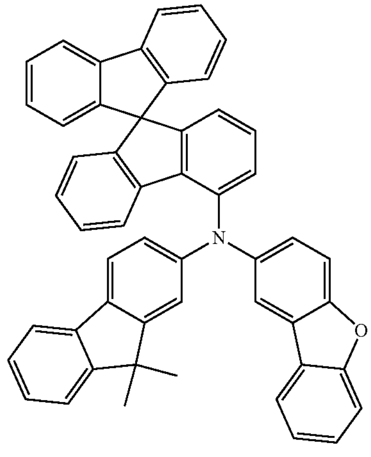

-continued

<EBM- 07>

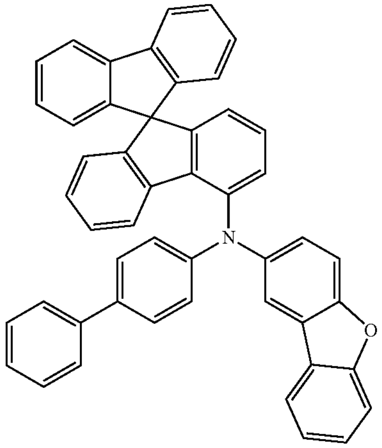

<EBM- 08>

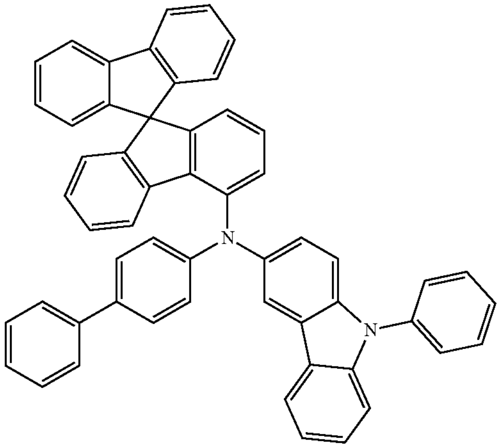

Figure 3:
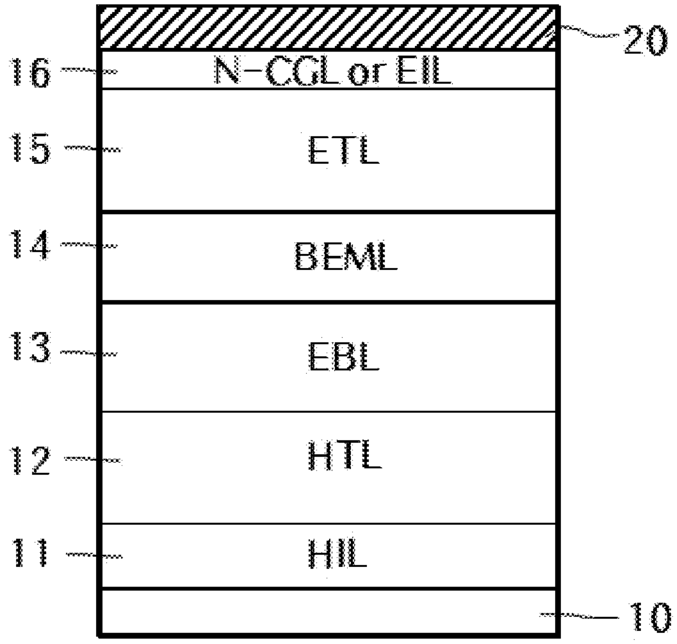
FIG. 3 illustrates a cross-sectional view of the light emitting device used in the experimental examples.

FIG. 3 illustrates a cross-sectional view of the light emitting device used in the experimental examples.

As illustrated in the example embodiment of FIG. 3, the light emitting devices used for the first experimental example group (Ex1-1 to Ex1-72) had the following configuration on the anode 10 formed of ITO.

DNTPD of Formula 3 and $MgF_2$ were mixed 1:1 on the anode 10, and the resulting mixture was deposited to a thickness of 7.5 nm to form a hole injection layer HIL 11.

[Formula 3]

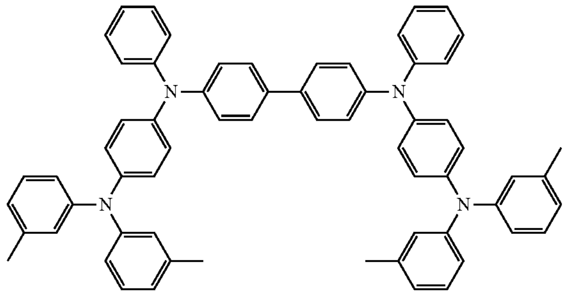

Then, α-NPD was deposited to a thickness of 80 nm on the hole injection layer 11 to form a hole transport layer (HTL, 12).

Then, an electron-blocking layer 13 was formed to a thickness of 20 nm on the hole transport layer 12 using any one of the materials of EBM-01 to EBM-08 as a material not substituted with deuterium in the first experimental example group (Ex1-1 to Ex1-72).

Then, MADN of Formula 4 doped with a boron-based dopant of DABNA-1 of Formula 5 was formed on the electron-blocking layer 13 to form a blue light emitting layer 14 having a thickness of 30 nm. In the blue light emitting layer 14, the boron-based dopant was doped at 3 wt % with respect to total weight of the MADN.

[Formula 4]

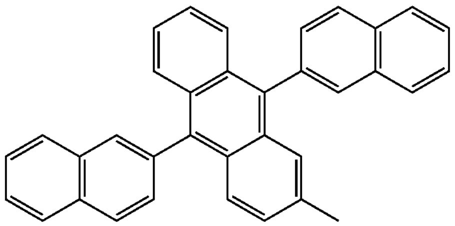

[Formula 5]

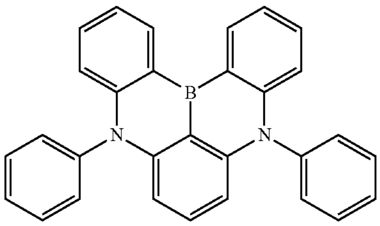

Then, an electron transport layer 15 was formed using any one of ETM-08, ETM-12, ETM-14, ETM-19, ETM-22, ETM-31, ETM-32, ETM-45 and ETM-54, among the electron transport materials of Formula 1.

Then, an electron injection layer or an n-type charge generation layer 16 containing Bphen of Formula 6 doped with 2 wt % Li was formed on the electron transport layer 15.

[Formula 6]

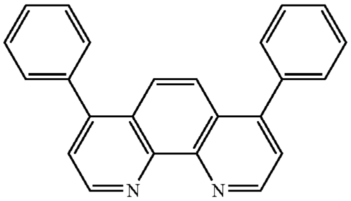

Then, a cathode 20 made of an aluminum (Al) component was formed on the electron injection layer or the n-type charge generation layer 16.

First, in the first experimental example group (Ex1-1 to Ex1-9) listed in Table 1-1, the material of the electron-blocking layer 13 was EBM-01, and the material of the electron transport layer 15 was changed to ETM-08, ETM-12, ETM-14, ETM-19, ETM-22, ETM-31, ETM-32, ETM-45, or ETM-54. The driving voltage, luminance, and external quantum efficiency were evaluated at a current density of 10 mA/cm$^2$, and the lifespan was comparatively evaluated at a high current density of 55 mA/cm$^2$ to determine the lifespan under accelerated conditions. The fifth experimental example (Ex1-5) of the first experimental example group among the experimental examples in Table 1-1 had the highest external quantum efficiency (EQE) and lifespan, so the lifespan of each of the remaining experimental examples was evaluated compared to the fifth experimental example.

TABLE 1-1

| | Structure | | Voltage[V], | luminance[Cd/A], | EQE(%), | Lifespan(%), |
|---|---|---|---|---|---|---|
| Item | EBL | ETL | 10 mA/cm$^2$ | 10 mA/cm$^2$ | 10 mA/cm$^2$ | 55 mA/cm$^2$ |
| Ex1-1 | EBM-01 | ETM-08 | 3.64 | 5.2 | 8.4 | 94 |
| Ex1-2 | EBM-01 | ETM-12 | 3.70 | 5.2 | 8.3 | 98 |
| Ex1-3 | EBM-01 | ETM-14 | 3.65 | 5.1 | 8.1 | 92 |
| Ex1-4 | EBM-01 | ETM-19 | 3.78 | 5.6 | 9.1 | 79 |
| Ex1-5 | EBM-01 | ETM-22 | 3.60 | 5.6 | 9.0 | 100 |
| Ex1-6 | EBM-01 | ETM-31 | 3.79 | 5.0 | 8.0 | 98 |
| Ex1-7 | EBM-01 | ETM-32 | 3.60 | 5.3 | 8.5 | 95 |
| Ex1-8 | EBM-01 | ETM-45 | 3.76 | 5.4 | 8.7 | 94 |
| Ex1-9 | EBM-01 | ETM-54 | 3.68 | 5.0 | 8.0 | 75 |

In the first experimental example group (Ex1-10 to Ex1-18) listed in Table 1-2, the material of the electron-blocking layer 13 was EBM-02, and the material of the electron transport layer 15 was changed to ETM-08, ETM-12, ETM-14, ETM-19, ETM-22, ETM-31, ETM-32, ETM-45 or ETM-54. The driving voltage, luminance, and external quantum efficiency were evaluated at a current density of 10 mA/cm$^2$, and the lifespan was comparatively evaluated at a high current density of 55 mA/cm$^2$ to determine the lifespan under accelerated conditions.

TABLE 1-2

| Item | Structure EBL | ETL | Voltage[V], 10 mA/cm$^2$ | Luminance [Cd/A], 10 mA/cm$^2$ | EQE(%), 10 mA/cm$^2$ | Lifespan(%), 55 mA/cm$^2$ |
|---|---|---|---|---|---|---|
| Ex1-10 | EBM-02 | ETM-08 | 3.66 | 5.3 | 8.6 | 93 |
| Ex1-11 | EBM-02 | ETM-12 | 3.67 | 5.2 | 8.4 | 92 |
| Ex1-12 | EBM-02 | ETM-14 | 3.65 | 5.3 | 8.5 | 98 |
| Ex1-13 | EBM-02 | ETM-19 | 3.65 | 5.4 | 8.7 | 93 |
| Ex1-14 | EBM-02 | ETM-22 | 3.62 | 5.4 | 8.7 | 97 |
| Ex1-15 | EBM-02 | ETM-31 | 3.71 | 5.7 | 9.1 | 75 |
| Ex1-16 | EBM-02 | ETM-32 | 3.61 | 5.6 | 8.9 | 85 |
| Ex1-17 | EBM-02 | ETM-45 | 3.79 | 5.6 | 9.0 | 95 |
| Ex1-18 | EBM-02 | ETM-54 | 3.63 | 4.9 | 7.9 | 103 |

In the first experimental example group (Ex1-19 to Ex1-27) listed in Table 1-3, the material of the electron-blocking layer 13 was EBM-03, and the material of the electron transport layer 15 was changed to ETM-08, ETM-12, ETM-14, ETM-19, ETM-22, ETM-31, ETM-32, ETM-45, or ETM-54. The driving voltage, luminance, and external quantum efficiency were evaluated at a current density of 10 mA/cm$^2$, and the lifespan was comparatively evaluated at a high current density of 55 mA/cm$^2$ to determine the lifespan under accelerated conditions.

TABLE 1-3

| Item | Structure EBL | ETL | Voltage[V], 10 mA/cm$^2$ | Luminance[Cd/A], 10 mA/cm$^2$ | EQE(%), 10 mA/cm$^2$ | Lifespan(%), 55 mA/cm$^2$ |
|---|---|---|---|---|---|---|
| Ex1-19 | EBM-03 | ETM-08 | 3.75 | 5.4 | 8.6 | 99 |
| Ex1-20 | EBM-03 | ETM-12 | 3.68 | 5.3 | 8.5 | 101 |
| Ex1-21 | EBM-03 | ETM-14 | 3.62 | 5.0 | 8.0 | 90 |
| Ex1-22 | EBM-03 | ETM-19 | 3.72 | 5.5 | 8.9 | 96 |
| Ex1-23 | EBM-03 | ETM-22 | 3.72 | 5.2 | 8.4 | 92 |
| Ex1-24 | EBM-03 | ETM-31 | 3.76 | 5.1 | 8.1 | 90 |
| Ex1-25 | EBM-03 | ETM-32 | 3.75 | 5.1 | 8.3 | 103 |
| Ex1-26 | EBM-03 | ETM-45 | 3.73 | 5.6 | 9.0 | 96 |
| Ex1-27 | EBM-03 | ETM-54 | 3.61 | 5.5 | 8.9 | 94 |

In the first experimental example group (Ex1-28 to Ex1-36) listed in Table 1-4, the material of the electron-blocking layer 13 was EBM-04, and the material of the electron transport layer 15 was changed to ETM-08, ETM-12, ETM-14, ETM-19, ETM-22, ETM-31, ETM-32, ETM-45, or ETM-54. The driving voltage, luminance, and external quantum efficiency were evaluated at a current density of 10 mA/cm$^2$, and the lifespan was comparatively evaluated at a high current density of 55 mA/cm$^2$ to determine the lifespan under accelerated conditions.

TABLE 1-4

| Item | Structure EBL | ETL | Voltage[V], 10 mA/cm$^2$ | Luminance[Cd/A], 10 mA/cm$^2$ | EQE(%), 10 mA/cm$^2$ | Lifespan(%), 55 mA/cm$^2$ |
|---|---|---|---|---|---|---|
| Ex1-28 | EBM-04 | ETM-08 | 3.75 | 5.4 | 8.7 | 95 |
| Ex1-29 | EBM-04 | ETM-12 | 3.64 | 5.1 | 8.2 | 85 |
| Ex1-30 | EBM-04 | ETM-14 | 3.71 | 5.7 | 9.1 | 83 |
| Ex1-31 | EBM-04 | ETM-19 | 3.67 | 5.3 | 8.6 | 77 |
| Ex1-32 | EBM-04 | ETM-22 | 3.75 | 5.6 | 9.0 | 84 |
| Ex1-33 | EBM-04 | ETM-31 | 3.70 | 5.6 | 9.1 | 88 |
| Ex1-34 | EBM-04 | ETM-32 | 3.62 | 5.0 | 8.0 | 79 |
| Ex1-35 | EBM-04 | ETM-45 | 3.78 | 5.0 | 8.0 | 85 |
| Ex1-36 | EBM-04 | ETM-54 | 3.73 | 5.2 | 8.3 | 94 |

In the first experimental example group (Ex1-37 to Ex1-45) listed in Table 1-5, the material of the electron-blocking layer 13 was EBM-05 and the material of the electron transport layer 15 was changed to ETM-08, ETM-12, ETM-14, ETM-19, ETM-22, ETM-31, ETM-32, ETM-45, or ETM-54. The driving voltage, luminance, and external quantum efficiency were evaluated at a current density of 10 mA/cm$^2$, and the lifespan was comparatively evaluated at a high current density of 55 mA/cm$^2$ to determine the lifespan under accelerated conditions.

TABLE 1-5

| | Structure | | Voltage[V], | Luminance[Cd/A], | EQE(%), | Lifespan(%), |
|---|---|---|---|---|---|---|
| Item | EBL | ETL | 10 mA/cm$^2$ | 10 mA/cm$^2$ | 10 mA/cm$^2$ | 55 mA/cm$^2$ |
| Ex1-37 | EBM-05 | ETM-08 | 3.64 | 4.9 | 7.96 | 76 |
| Ex1-38 | EBM-05 | ETM-12 | 3.60 | 5.3 | 8.5 | 95 |
| Ex1-39 | EBM-05 | ETM-14 | 3.72 | 5.2 | 8.4 | 99 |
| Ex1-40 | EBM-05 | ETM-19 | 3.73 | 5.1 | 8.2 | 82 |
| Ex1-41 | EBM-05 | ETM-22 | 3.64 | 5.0 | 8.1 | 92 |
| Ex1-42 | EBM-05 | ETM-31 | 3.71 | 5.5 | 8.8 | 93 |
| Ex1-43 | EBM-05 | ETM-32 | 3.75 | 5.0 | 8.1 | 83 |
| Ex1-44 | EBM-05 | ETM-45 | 3.62 | 5.0 | 8.0 | 94 |
| Ex1-45 | EBM-05 | ETM-54 | 3.77 | 4.9 | 7.9 | 98 |

In the first experimental example group (Ex1-46 to Ex1-54) listed in Table 1-6, the material of the electron-blocking layer 13 was EBM-06 and the material of the electron transport layer 15 was changed to ETM-08, ETM-12, ETM-14, ETM-19, ETM-22, ETM-31, ETM-32, ETM-45, or ETM-54. The driving voltage, luminance, and external quantum efficiency were evaluated at a current density of 10 mA/cm$^2$, and the lifespan was comparatively evaluated at a high current density of 55 mA/cm$^2$ to determine the lifespan under accelerated conditions.

TABLE 1-6

| | Structure | | Voltage[V], | Luminance[Cd/A], | EQE(%), | Lifespan(%), |
|---|---|---|---|---|---|---|
| Item | EBL | ETL | 10 mA/cm$^2$ | 10 mA/cm$^2$ | 10 mA/cm$^2$ | 55 mA/cm$^2$ |
| Ex1-46 | EBM-06 | ETM-08 | 3.68 | 5.6 | 9.0 | 94 |
| Ex1-47 | EBM-06 | ETM-12 | 3.77 | 5.1 | 8.2 | 76 |
| Ex1-48 | EBM-06 | ETM-14 | 3.72 | 5.4 | 8.7 | 92 |
| Ex1-49 | EBM-06 | ETM-19 | 3.74 | 5.0 | 8.0 | 77 |
| Ex1-50 | EBM-06 | ETM-22 | 3.66 | 4.9 | 7.9 | 101 |
| Ex1-51 | EBM-06 | ETM-31 | 3.65 | 5.6 | 8.9 | 83 |
| Ex1-52 | EBM-06 | ETM-32 | 3.77 | 5.6 | 9.0 | 92 |
| Ex1-53 | EBM-06 | ETM-45 | 3.68 | 5.5 | 8.9 | 96 |
| Ex1-54 | EBM-06 | ETM-54 | 3.67 | 5.3 | 8.5 | 93 |

In the first experimental example group (Ex1-55 to Ex1-63) listed in Table 1-7, the material of the electron-blocking layer 13 was EBM-07, and the material of the electron transport layer 15 was changed to ETM-08, ETM-12, ETM-14, ETM-19, ETM-22, ETM-31, ETM-32, ETM-45, or ETM-54. The driving voltage, luminance, and external quantum efficiency were evaluated at a current density of 10 mA/cm$^2$, and the lifespan was comparatively evaluated at a high current density of 55 mA/cm$^2$ to determine the lifespan under accelerated conditions.

TABLE 1-7

| | Structure | | Voltage[V], | Luminance[Cd/A], | EQE(%), | Lifespan(%), |
|---|---|---|---|---|---|---|
| Item | EBL | ETL | 10 mA/cm$^2$ | 10 mA/cm$^2$ | 10 mA/cm$^2$ | 55 mA/cm$^2$ |
| Ex1-55 | EBM-07 | ETM-08 | 3.64 | 4.9 | 7.8 | 75 |
| Ex1-56 | EBM-07 | ETM-12 | 3.73 | 5.4 | 8.6 | 89 |
| Ex1-57 | EBM-07 | ETM-14 | 3.76 | 5.1 | 8.2 | 84 |

TABLE 1-7-continued

| Item | Structure EBL | Structure ETL | Voltage[V], 10 mA/cm$^2$ | Luminance[Cd/A], 10 mA/cm$^2$ | EQE(%), 10 mA/cm$^2$ | Lifespan(%), 55 mA/cm$^2$ |
|---|---|---|---|---|---|---|
| Ex1-58 | EBM-07 | ETM-19 | 3.67 | 5.3 | 8.6 | 92 |
| Ex1-59 | EBM-07 | ETM-22 | 3.77 | 5.0 | 8.0 | 81 |
| Ex1-60 | EBM-07 | ETM-31 | 3.71 | 5.0 | 8.1 | 80 |
| Ex1-61 | EBM-07 | ETM-32 | 3.65 | 5.2 | 8.4 | 79 |
| Ex1-62 | EBM-07 | ETM-45 | 3.69 | 5.2 | 8.3 | 78 |
| Ex1-63 | EBM-07 | ETM-54 | 3.73 | 5.0 | 8.1 | 88 |

In the first experimental example group (Ex1-64 to Ex1-72) listed in Table 1-8, the material of the electron-blocking layer 13 was EBM-08 and the material of the electron transport layer 15 was changed to ETM-08, ETM-12, ETM-14, ETM-19, ETM-22, ETM-31, ETM-32, ETM-45, or ETM-54. The driving voltage, luminance, and external quantum efficiency were evaluated at a current density of 10 mA/cm$^2$, and the lifespan was comparatively evaluated at a high current density of 55 mA/cm$^2$ to determine the lifespan under accelerated conditions.

TABLE 1-8

| Item | Structure EBL | Structure ETL | Voltage[V], 10 mA/cm$^2$ | Luminance[Cd/A], 10 mA/cm$^2$ | EQE(%), 10 mA/cm$^2$ | Lifespan(%), 55 mA/cm$^2$ |
|---|---|---|---|---|---|---|
| Ex1-64 | EBM-08 | ETM-08 | 3.76 | 5.3 | 8.5 | 77 |
| Ex1-65 | EBM-08 | ETM-12 | 3.79 | 5.4 | 8.7 | 96 |
| Ex1-66 | EBM-08 | ETM-14 | 3.64 | 5.4 | 8.6 | 91 |
| Ex1-67 | EBM-08 | ETM-19 | 3.61 | 5.2 | 8.3 | 93 |
| Ex1-68 | EBM-08 | ETM-22 | 3.68 | 5.3 | 8.5 | 91 |
| Ex1-69 | EBM-08 | ETM-31 | 3.78 | 5.3 | 8.4 | 99 |
| Ex1-70 | EBM-08 | ETM-32 | 3.62 | 5.3 | 8.4 | 76 |
| Ex1-71 | EBM-08 | ETM-45 | 3.64 | 5.6 | 9.0 | 81 |
| Ex1-72 | EBM-08 | ETM-54 | 3.60 | 5.4 | 8.7 | 96 |

It may be seen that in the above-described first experimental example group (Ex1-1 to Ex1-72), the driving voltage at a current density of 10 mA/cm$^2$ was 3.60V to 3.79V, the luminance was 4.9 Cd/A to 5.7 Cd/A, and the external quantum efficiency was 7.8% to 9.0%.

In a comparative example having a structure as illustrated in the example embodiment of FIG. 3, TAPC of Formula 7 was used as the material for the electron-blocking layer 13, and the material of Formula 8, which has a benzimidazole group, was used as the material for the electron transport layer 15.

[Formula 7]

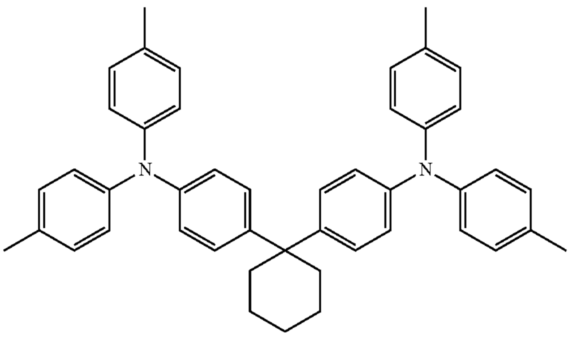

-continued

[Formula 8]

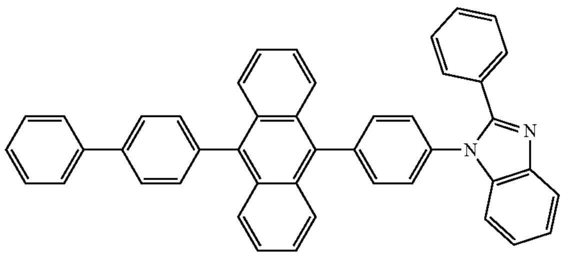

In the comparative example, the driving voltage at the same current density of 10 mA/cm$^2$ was 3.95 V, the luminance was 3.9 Cd/A, and the external quantum efficiency was 3.9%.

Compared to the comparative example, the first experimental example group (Ex1-1 to Ex1-72) exhibited an at least two-fold increase in external quantum efficiency, reduced driving voltage, and increased luminance. This improvement may be due to the change in the material of the electron transport layer.

Hereinafter, the effectiveness of the electron-blocking layer as a function of the degree of substitution with deuterium will be described in relation to the second experimental example group and the third experimental example group.

In the second experimental example group (Ex2-1 to Ex2-32), the structure as illustrated in the example embodiment of FIG. 3 was used, the material of the electron-blocking layer 13 was changed to one of EBM-09 to EBM-16, and the material of the electron transport layer 15 was changed to ETM-08, ETM-19, ETM-31, or ETM-45. The driving voltage, luminance, and external quantum efficiency at a current density of 10 $mA/cm^2$ were evaluated, and the lifespan at a high current density of 55 $mA/cm^2$ was comparatively evaluated to determine the lifespan under accelerated conditions.

TABLE 2

| Item | Structure EBL | Structure ETL | Voltage [V] at 10 $mA/cm^2$ | Luminance [Cd/A] at 10 $mA/cm^2$ | EQE (%) at 10 $mA/cm^2$ | Lifespan (%) at 55 $mA/cm^2$ |
|---|---|---|---|---|---|---|
| Ex2-1 | EBM-09 | ETM-08 | 3.74 | 5.5 | 8.9 | 95 |
| Ex2-2 | EBM-09 | ETM-19 | 3.77 | 5.4 | 8.8 | 101 |
| Ex2-3 | EBM-09 | ETM-31 | 3.69 | 5.7 | 9.1 | 93 |
| Ex2-4 | EBM-09 | ETM-45 | 3.72 | 5.6 | 9.0 | 110 |
| Ex2-5 | EBM-10 | ETM-08 | 3.62 | 5.6 | 9.0 | 104 |
| Ex2-6 | EBM-10 | ETM-19 | 3.79 | 5.5 | 8.8 | 106 |
| Ex2-7 | EBM-10 | ETM-31 | 3.75 | 5.5 | 8.8 | 113 |
| Ex2-8 | EBM-10 | ETM-45 | 3.62 | 5.5 | 8.9 | 110 |
| Ex2-9 | EBM-11 | ETM-08 | 3.64 | 5.7 | 9.1 | 99 |
| Ex2-10 | EBM-11 | ETM-19 | 3.66 | 5.6 | 8.9 | 115 |
| Ex2-11 | EBM-11 | ETM-31 | 3.68 | 5.7 | 9.1 | 112 |
| Ex2-12 | EBM-11 | ETM-45 | 3.78 | 5.5 | 8.8 | 90 |
| Ex2-13 | EBM-12 | ETM-08 | 3.62 | 5.5 | 8.8 | 116 |
| Ex2-14 | EBM-12 | ETM-19 | 3.61 | 5.6 | 8.9 | 96 |
| Ex2-15 | EBM-12 | ETM-31 | 3.64 | 5.5 | 8.8 | 92 |
| Ex2-16 | EBM-12 | ETM-45 | 3.67 | 5.6 | 9.1 | 95 |
| Ex2-17 | EBM-13 | ETM-08 | 3.62 | 5.5 | 8.8 | 105 |
| Ex2-18 | EBM-13 | ETM-19 | 3.73 | 5.4 | 8.7 | 119 |
| Ex2-19 | EBM-13 | ETM-31 | 3.66 | 5.6 | 9.0 | 105 |
| Ex2-20 | EBM-13 | ETM-45 | 3.78 | 5.6 | 9.1 | 91 |
| Ex2-21 | EBM-14 | ETM-08 | 3.73 | 5.6 | 9.0 | 101 |
| Ex2-22 | EBM-14 | ETM-19 | 3.68 | 5.7 | 9.1 | 94 |
| Ex2-23 | EBM-14 | ETM-31 | 3.62 | 5.7 | 8.8 | 109 |
| Ex2-24 | EBM-14 | ETM-45 | 3.60 | 5.7 | 8.9 | 113 |
| Ex2-25 | EBM-15 | ETM-08 | 3.69 | 5.6 | 9.0 | 100 |
| Ex2-26 | EBM-15 | ETM-19 | 3.77 | 5.6 | 9.0 | 112 |
| Ex2-27 | EBM-15 | ETM-31 | 3.65 | 5.5 | 8.8 | 106 |
| Ex2-28 | EBM-15 | ETM-45 | 3.64 | 5.7 | 9.0 | 95 |
| Ex2-29 | EBM-16 | ETM-08 | 3.77 | 5.5 | 8.8 | 116 |
| Ex2-30 | EBM-16 | ETM-19 | 3.79 | 5.5 | 8.8 | 97 |
| Ex2-31 | EBM-16 | ETM-31 | 3.66 | 5.4 | 8.7 | 109 |
| Ex2-32 | EBM-16 | ETM-45 | 3.76 | 5.6 | 9.0 | 107 |

Electron-blocking materials (EBM-09 to EBM-16) containing a spirofluorene substituted with deuterium were used in the second experimental example group (Ex2-1 to Ex2-32). In the second experimental example group (Ex2-1 to Ex2-32), the electron transport materials were the same as the first experimental example group (Ex1-1 to Ex1-72) but the deuterium substitution state of the material in the electron-blocking layer was different. Comparing the second experimental example group (Ex2-1 to Ex2-32) and the first experimental example group (Ex1-1 to Ex1-72), the second experimental example group (Ex2-1 to Ex2-32) showed a slight change in efficiency but the lifespan was improved by about 10%.

In the third experimental example group (Ex3-1 to Ex3-32), the structure as illustrated in the example embodiment of FIG. 3 was used, the material of the electron-blocking layer 13 was changed to one of EBM-17 to EBM-27, and the material of the electron transport layer 15 was changed to ETM-08, ETM-19, ETM-31 or ETM-45. The driving voltage, luminance, and external quantum efficiency at a current density of 10 $mA/cm^2$ were evaluated, and the lifespan at a high current density of 55 $mA/cm^2$ was comparatively evaluated to determine the lifespan under accelerated conditions.

TABLE 3

| | Structure | | Voltage [V] at | Luminance [Cd/A] at | EQE (%) at | Lifespan (%) at |
|---|---|---|---|---|---|---|
| Item | EBL | ETL | 10 mA/cm$^2$ | 10 mA/cm$^2$ | 10 mA/cm$^2$ | 55 mA/cm$^2$ |
| Ex3-1 | EBM-17 | ETM-08 | 3.64 | 5.5 | 8.8 | 124 |
| Ex3-2 | EBM-17 | ETM-19 | 3.72 | 5.6 | 9.1 | 128 |
| Ex3-3 | EBM-17 | ETM-31 | 3.63 | 5.5 | 8.8 | 107 |
| Ex3-4 | EBM-17 | ETM-45 | 3.68 | 5.6 | 9.0 | 110 |
| Ex3-5 | EBM-18 | ETM-08 | 3.68 | 5.4 | 8.7 | 131 |
| Ex3-6 | EBM-18 | ETM-19 | 3.68 | 5.7 | 9.1 | 106 |
| Ex3-7 | EBM-18 | ETM-31 | 3.66 | 5.4 | 8.7 | 114 |
| Ex3-8 | EBM-18 | ETM-45 | 3.72 | 5.5 | 8.9 | 133 |
| Ex3-9 | EBM-19 | ETM-08 | 3.65 | 5.6 | 8.9 | 128 |
| Ex3-10 | EBM-19 | ETM-19 | 3.80 | 5.6 | 9.0 | 117 |
| Ex3-11 | EBM-19 | ETM-31 | 3.62 | 5.4 | 8.8 | 109 |
| Ex3-12 | EBM-19 | ETM-45 | 3.79 | 5.5 | 8.8 | 120 |
| Ex3-13 | EBM-20 | ETM-08 | 3.73 | 5.6 | 9.0 | 127 |
| Ex3-14 | EBM-20 | ETM-19 | 3.69 | 5.5 | 8.8 | 115 |
| Ex3-15 | EBM-20 | ETM-31 | 3.63 | 5.5 | 8.9 | 130 |
| Ex3-16 | EBM-20 | ETM-45 | 3.60 | 5.7 | 9.1 | 113 |
| Ex3-17 | EBM-21 | ETM-08 | 3.73 | 5.5 | 8.9 | 107 |
| Ex3-18 | EBM-21 | ETM-19 | 3.65 | 5.5 | 8.8 | 115 |
| Ex3-19 | EBM-21 | ETM-31 | 3.75 | 5.5 | 8.8 | 109 |
| Ex3-20 | EBM-21 | ETM-45 | 3.73 | 5.5 | 8.8 | 113 |
| Ex3-21 | EBM-22 | ETM-08 | 3.80 | 5.5 | 8.8 | 127 |
| Ex3-22 | EBM-22 | ETM-19 | 3.69 | 5.4 | 8.7 | 114 |
| Ex3-23 | EBM-22 | ETM-31 | 3.80 | 5.7 | 9.1 | 108 |
| Ex3-24 | EBM-22 | ETM-45 | 3.66 | 5.7 | 9.1 | 129 |
| Ex3-25 | EBM-23 | ETM-08 | 3.66 | 5.5 | 8.9 | 117 |
| Ex3-26 | EBM-23 | ETM-19 | 3.75 | 5.5 | 8.9 | 118 |
| Ex3-27 | EBM-23 | ETM-31 | 3.79 | 5.6 | 9.1 | 109 |
| Ex3-28 | EBM-23 | ETM-45 | 3.74 | 5.5 | 8.8 | 113 |
| Ex3-29 | EBM-24 | ETM-08 | 3.63 | 5.5 | 8.8 | 113 |
| Ex3-30 | EBM-24 | ETM-19 | 3.72 | 5.5 | 8.9 | 129 |
| Ex3-31 | EBM-24 | ETM-31 | 3.79 | 5.7 | 9.1 | 112 |
| Ex3-32 | EBM-24 | ETM-45 | 3.78 | 5.6 | 8.9 | 134 |

Electron-blocking materials (EBM-17 to EBM-24) in which fluorene and phenyl as well as spiro were substituted with deuterium were used in the third experimental example group (Ex3-1 to Ex3-32). In the third experimental example group (Ex3-1 to Ex3-32), the electron transport material were the same as the first experimental example group (Ex1-1 to Ex1-72) but the deuterium substitution state of the material in the electron-blocking layer was different. Comparing the third experimental example group (Ex3-1 to Ex3-32) and the first experimental example group (Ex1-1 to Ex1-72), the third experimental example group (Ex3-1 to Ex3-32) showed a slight change in efficiency but the lifespan was improved by about 20% or more.

It may be seen that when the electron transport material having excellent or high efficiency was used for the electron transport layer in the experiments of the second and third experimental example groups (Ex2-1 to Ex2-32, Ex3-1 to Ex3-32), lifespan characteristics were maintained or improved by substituting the material of the electron-blocking layer with deuterium.

Figure 4:
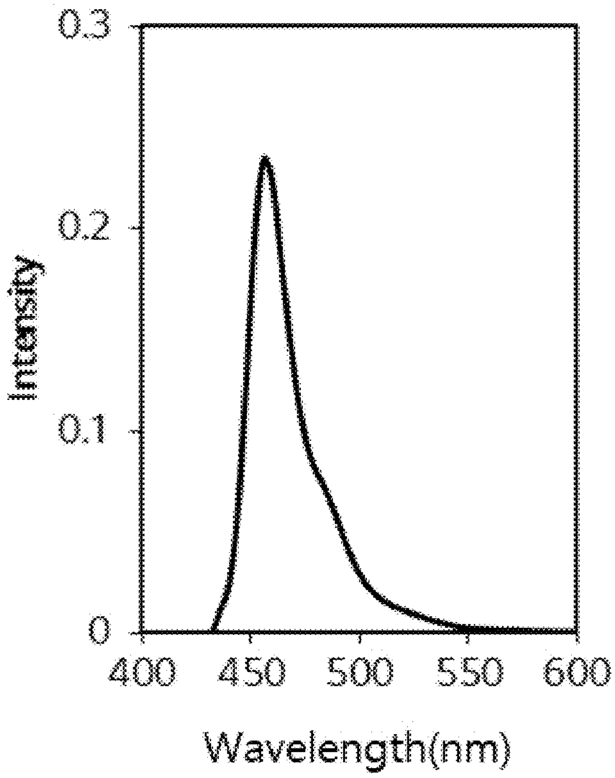
FIG. 4 is a graph showing the emission spectrum of the light emitting device used in experimental examples.

FIG. 4 is a graph showing the emission spectrum of the light emitting device used in experimental examples.

All of the first experimental example group (Ex1-1 to Ex1-72), the second experimental example group (Ex2-1 to Ex2-32), and the third experimental example group (Ex3-1 to Ex-3-32) used boron-based dopants having an emission peak of approximately 450 nm to 455 nm and emit light in a blue wavelength range, as illustrated in FIG. 4.

In the experiments described above, the material of Formula 5 was used as the boron-based dopant. Any one of the materials of Formulas 9 to 16 may also be used as the boron-based dopant of the fluorescent blue light emitting layer in the light emitting device according to an example embodiment of the present disclosure. Any one of the materials of Formulas 9 to 16 may enable emission of blue light having an emission peak of 430 nm to 480 nm.

[Formula 9]

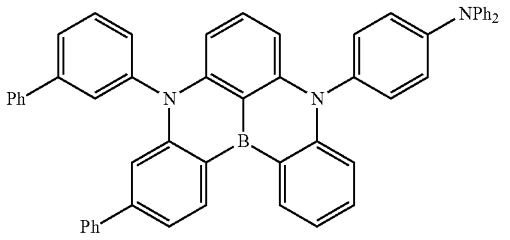

[Formula 10]

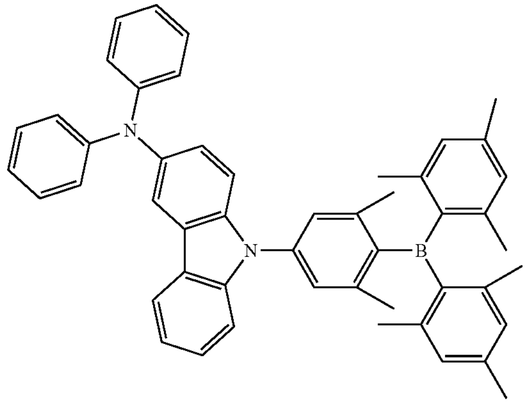

-continued

[Formula 11]

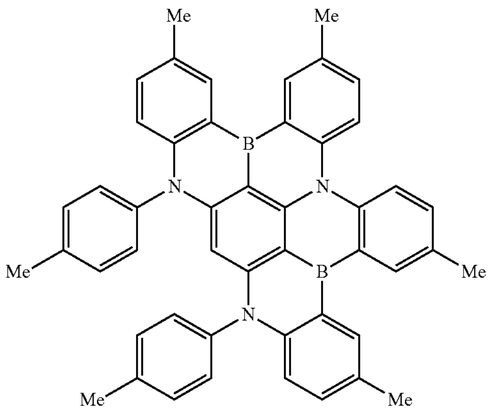

[Formula 12]

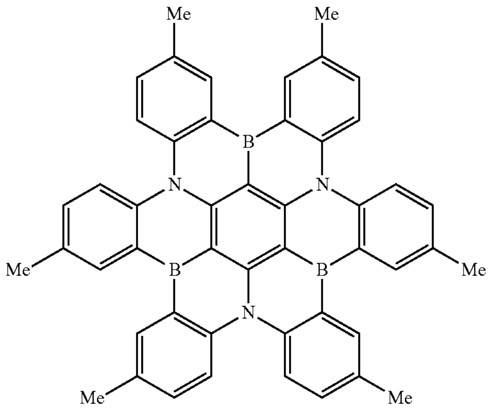

[Formula 13]

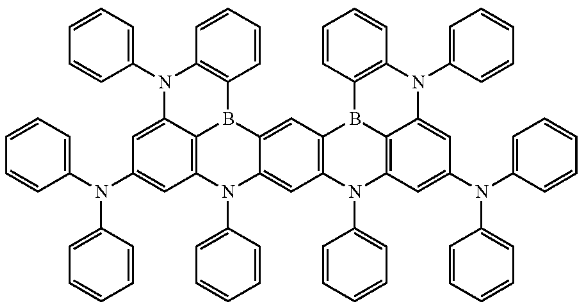

[Formula 14]

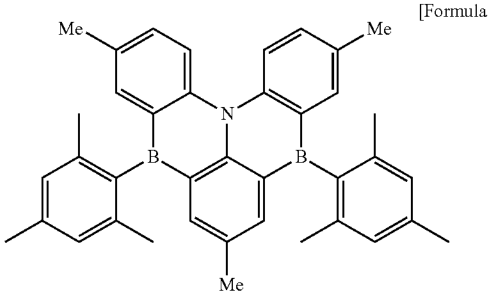

-continued

[Formula 15]

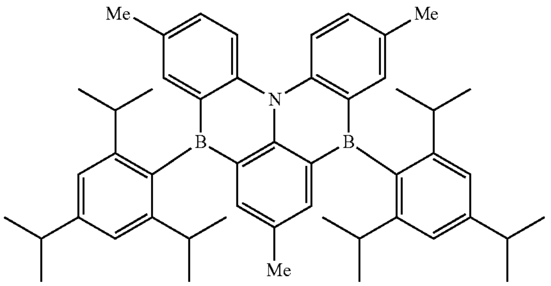

[Formula 16]

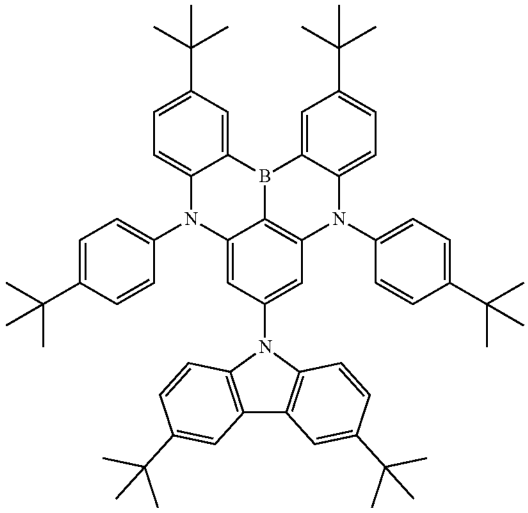

Hereinafter, a light emitting device according to an example embodiment of the present disclosure and a light emitting display using the same will be described.

Figure 5:
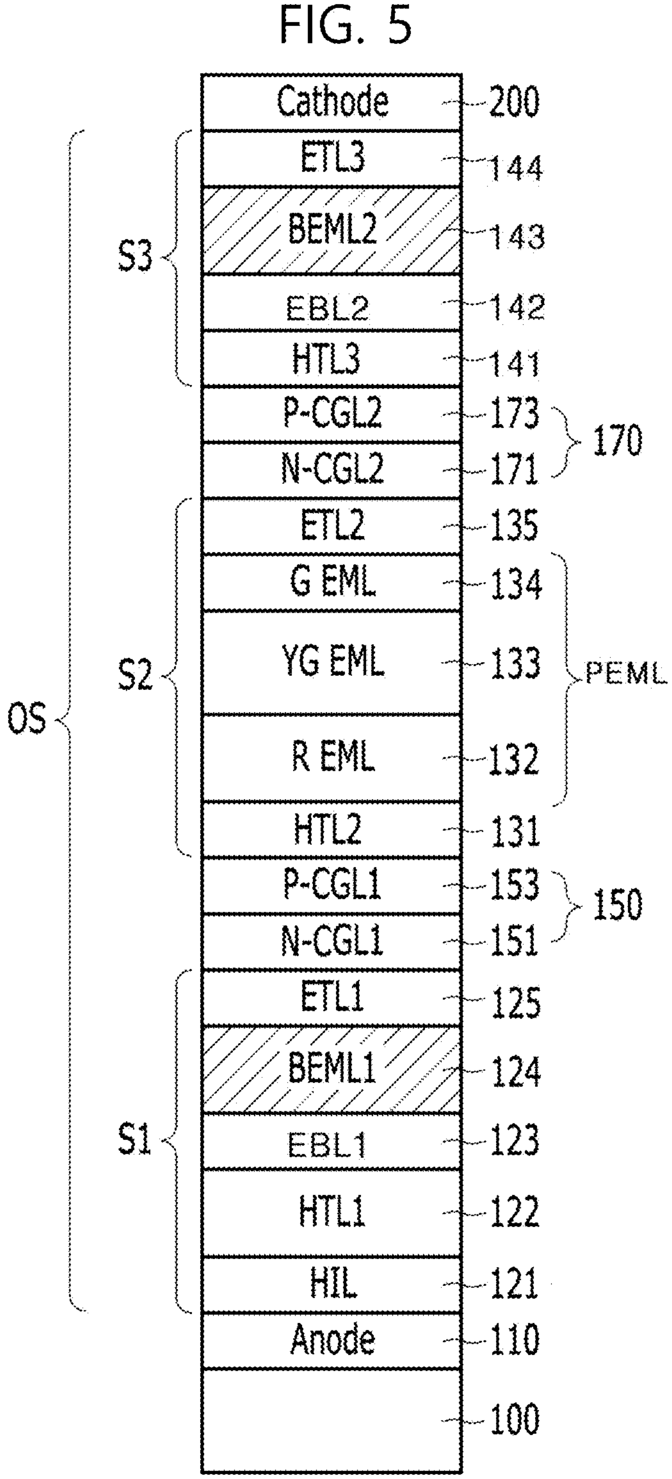
FIG. 5 illustrates a cross-sectional view of a light emitting device according to an example embodiment of the present disclosure.

FIG. 5 illustrates a cross-sectional view of a light emitting device according to an example embodiment of the present disclosure.

As illustrated in the example embodiment of FIG. 5, the light emitting device according to an example embodiment of the present disclosure may have three stacks S1, S2, and S3 between the anode 110 and the cathode 200. Here, the first to third stacks S1, S2, and S3 are divided by the first and second charge generation layers 150 and 170. The first stack S1 includes a hole injection layer 121, a first hole transport layer 122, a first electron-blocking layer 123 formed of or include the second material including the compound of Formula 2, a first blue light emitting layer 124 containing a boron-based fluorescent dopant, and a first electron transport layer 125 formed of or include the first material of Formula 1, sequentially stacked between the anode 110 and the first charge generation layer 150.

The second stack S2 is disposed between the first and second charge generation layers 150 and 170. The second stack S2 includes a phosphorescent light emitting layer (PEML) including a red light emitting layer 132, a yellowish green light emitting layer 133, and a green light emitting layer 134 stacked in the order, a second hole transport layer 131 under the red light emitting layer 132, and a second electron transport layer 135 on the green light emitting layer 134.

The third stack S3 is disposed between the second charge generation layer 170 and the cathode 200. The third stack S3 includes a third hole transport layer 141, a second electron-blocking layer 142, a second blue light emitting layer 143, and a third electron transport layer 144, which are sequentially stacked.

In addition, the cathode 200 may be formed on the second electron transport layer 144. In some embodiments, an electron injection layer may be further formed between the third electron transport layer 144 and the cathode 200.

The first and second charge generation layers 150 and 170 between the stacks include n-type charge generation layers 151 and 171, each functioning to produce electrons and transfer the electrons to an adjacent stack. The first and second charge generation layers 150 and 170 also include p-type charge generation layers 153 and 173, each functioning to produce holes and transfer the holes to an adjacent stack. In some embodiments, the first and second charge generation layers 150 and 170 may be also formed as a single layer by doping one or more hosts with both an n-type dopant and a p-type dopant.

As described above, the first electron-blocking layer 123, the first blue light emitting layer 124, and the first electron transport layer 125 of the first stack S1 may function as the electron-transport-and-blocking unit described in the example embodiment of FIG. 2. Blue light emission efficiency may be improved by changing the material. A decrease in lifespan may be more effectively prevented or reduced by avoiding accumulation of excitons and electrons at the interface between the first electron-blocking layer 123 and the first blue light emitting layer 124. Similarly, the second electron-blocking layer 142, the second blue light emitting layer 143, and the third electron transport layer 144 of the third stack S3 may function as the electron transport blocking unit described in the example embodiment of FIG. 2. Blue light emission efficiency may be improved by changing the material. A decrease in lifespan may be more effectively prevented or reduced by avoiding accumulation of excitons and electrons at the interface between the second electron-blocking layer 142 and the second blue light emitting layer 143.

In addition, when the electron injection layer is formed adjacent to the cathode 200, metal doping may be performed to increase electron injection efficiency. In some embodiments, the third electron transport layer 144 may be formed using a mixture including benzimidazole of Formula 8 and the first material of Formula 1 described above.

Figure 6:
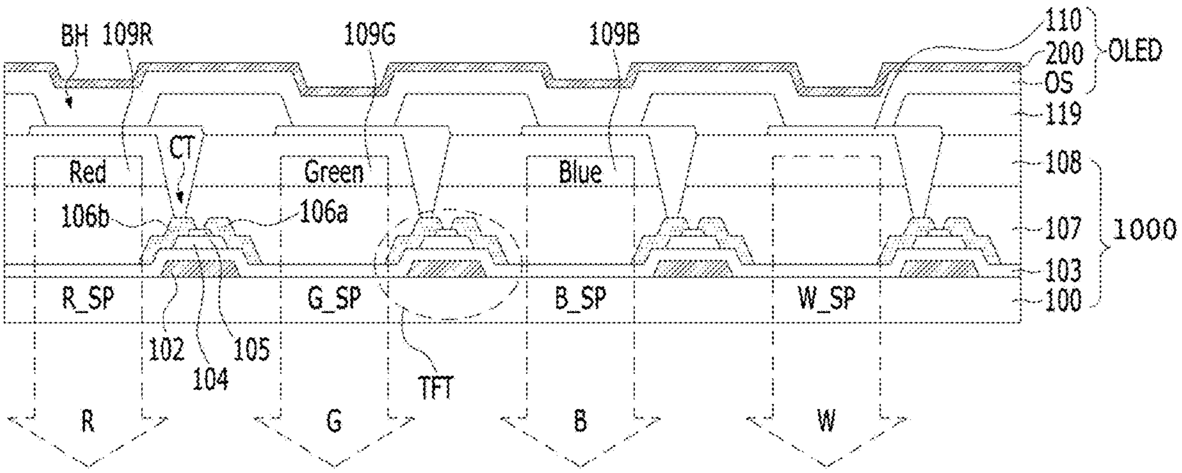
FIG. 6 illustrates a cross-sectional view of a light emitting display using the light emitting device according to an example embodiment of the present disclosure.

FIG. 6 illustrates a cross-sectional view of a light emitting display using the light emitting device according to an example embodiment of the present disclosure.

The light emitting device may be commonly applied to a plurality of subpixels to emit white light to a light emitting electrode.

As illustrated in the example embodiment of FIG. 6, the light emitting display according to an example embodiment of the present disclosure includes a substrate 100 having a plurality of subpixels R_SP, G_SP, B_SP, and W_SP, a light emitting device (also referred to as "OLED, organic light emitting diode") commonly provided on the substrate 100, a thin film transistor (TFT) provided in each of the subpixels and connected to the anode 110 of the light emitting device (OLED), and color filters 109R, 109G, or 109B provided below the anode 110 of at least one of the subpixels.

The illustrated example embodiment relates to a configuration including the white subpixel W_SP, but the present disclosure is not limited thereto. A configuration in which the white subpixel W_SP is omitted and only the red, green, and blue subpixels R_SP, G_SP, and B_SP are provided is also possible. In some embodiments, a combination of a cyan subpixel, a magenta subpixel, and a yellow subpixel capable of creating white by replacing the red, green, and blue subpixels is possible.

The thin film transistor TFT includes, for example, a gate electrode 102, a semiconductor layer 104, and a source electrode 106*a* and a drain electrode 106*b* connected to each side of the semiconductor layer 104. In addition, a channel protection layer 105 may be further provided on the portion where the channel of the semiconductor layer 104 is located to prevent or reduce direct connection between the source/drain electrodes 106*a* and 106*b* and the semiconductor layer 104.

A gate insulating layer 103 is provided between the gate electrode 102 and the semiconductor layer 104.

The semiconductor layer 104 may be formed of, for example, an oxide semiconductor, amorphous silicon, polycrystalline silicon, or a combination thereof. For example, when the semiconductor layer 104 is an oxide semiconductor, the heating temperature for forming the thin film transistor may be lowered. Thus, the substrate 100 may be selected from a greater variety of available types so that the semiconductor layer 104 may be advantageously applied to a flexible display device.

In addition, the drain electrode 106*b* of the thin film transistor TFT may be connected to the anode 110 through a contact hole CT formed in the first and second passivation layers 107 and 108.

The first passivation layer 107 is provided to protect the thin film transistor TFT. Color filters 109R, 109G, and 109B may be provided thereon.

When the plurality of subpixels includes a red subpixel, a green subpixel, a blue subpixel, and a white subpixel, the color filter may include first to third color filters 109R, 109G, and 109B in each of the subpixels excluding the white subpixel W_SP. The color filters may allow the emitted white light to pass through the anode 110 for each wavelength. A second passivation layer 108 is formed under the anode 110 to cover the first to third color filters 109R, 109G, and 109B. The anode 110 is formed on the surface of the second passivation layer 108 excluding the contact hole CT.

Here, a configuration from the substrate 100 to the thin film transistor TFT, color filters 109R, 109G, and 109B, and the first and second passivation layers 107 and 108 is referred to as a "thin film transistor array substrate" 1000.

The light emitting device OLED is formed on the thin film transistor array substrate 1000 including the bank 119, which is adjacent to a light emitting part BH. The light emitting device OLED includes, for example, a transparent anode 110, a cathode 200 that faces the anode 110 and is formed of a reflective electrode, and an electron transport and blocking unit ETBU disposed in the blue light emitting stacks S1 and S3 among the stacks divided by the first and second charge generation layers CGL1 and CGL2 between the anode 110 and the cathode 200, as illustrated in the example embodiments of FIGS. 1A to 2 and 5. The electron transport and blocking unit ETBU includes an electron-blocking layer 123 formed of the electron-blocking material of Formula 2, a blue light emitting layer 124 containing a boron-based blue dopant, and an electron transport layer 125 containing the electron transport material of Formula 1.

The anode 110 is divided for each subpixel. The remaining layers of the white-light emitting device OLED are integrally provided in the entire display area, rather than being divided for each subpixel.

When the blue light emitting stack having the electron transport and blocking unit (ETBU) is provided, the material of the electron transport layer in contact with the fluorescent blue light emitting layer, which may have limited internal quantum efficiency, may include the first material represented by Formula 1. The efficiency of the fluorescent light emitting layer may be improved by enhancing the electron transport efficiency.

In addition, when the electron transport layer is formed using a material that may be capable of rapidly transporting electrons, the material of the electron-blocking layer in contact with the fluorescent blue light emitting layer is substituted with deuterium to prevent or reduce accumulation of electrons or excitons at the interface between the fluorescent blue light emitting layer and the electron-blocking layer. Improved efficiency, luminance, and quantum efficiency may be achieved without reducing the lifespan.

In addition, improving the efficiency of the blue fluorescent stack including the fluorescent blue light emitting layer may reduce the number of blue stacks in a light emitting device realizing white light. Thus, the number of stacks to realize the same efficiency of white may be reduced. The yield based on reduced driving voltage and simplified processing may be improved.

Example embodiments of the present disclosure can also be described as follows:

In example embodiments of the present disclosure, a light emitting device includes an anode and a cathode facing each other, a first stack and a second stack disposed between the anode and the cathode, the first stack including a first electron transport layer including the first material of Formula 1, a first blue light emitting layer containing a boron-based compound emitting light having a wavelength of 430 nm to 480 nm, and a first electron-blocking layer including a second material including a spirofluorene group, and at least one hydrogen atom on at least one side of the spirofluorene group is substituted by deuterium, and the second stack includes at least two phosphorescent light emitting layers emitting light having a longer wavelength than that of the light emitted by the first blue light emitting layer, and a charge generation layer disposed between the first stack and the second stack, wherein the Formula 1 is:

[Formula 1]

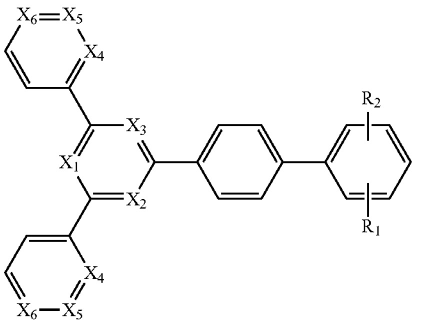

$R_1$ and $R_2$ are each independently selected from a cycloalkyl group, an aryl group, and a heteroaryl group, $X_1$, $X_2$, and $X_3$ are each independently N or CH, $X_4$, $X_5$ or $X_6$ is N, and remaining of $X_4$, $X_5$, and $X_6$ are CH.

In some embodiments, the second material may include a compound represented by Formula 2 below:

[Formula 2]

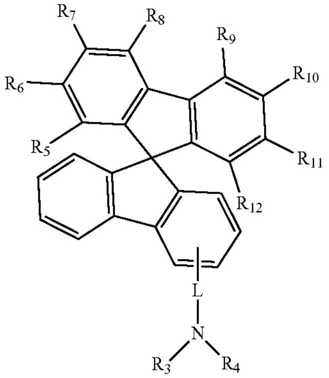

L is a single bond, or is selected from a deuterium-substituted or unsubstituted phenylene group and a deuterium-substituted or unsubstituted naphthylene group, $R_3$ and $R_4$ are each independently selected from a deuterium-substituted phenyl group, a deuterium-substituted or unsubstituted biphenyl group, and a deuterium-substituted or unsubstituted heteroaryl group, $R_5$ to $R_{12}$ are each a deuterium.

In some embodiments, the first electron-blocking layer may be in contact with one surface of the first blue light emitting layer, the first electron transport layer may be in contact with the other surface of the first blue light emitting layer, and the one surface and the other surface of the first blue light emitting layer may face each other with a gap therebetween corresponding to a thickness of the first blue light emitting layer.

In some embodiments, the at least two phosphorescent light emitting layers may include a red light emitting layer adjacent to the first stack and a green light emitting layer adjacent to the cathode.

In some embodiments, a yellowish green light emitting layer may be further included between the red light emitting layer and the green light emitting layer.

In some embodiments, the light emitting device may further include at least one stack between the second stack and the cathode, wherein the at least one stack between the second stack and the cathode includes a second electron-blocking layer including the second material, the second blue light emitting layer emitting the same color as the first blue light emitting layer, and a second electron transport layer including the first material.

In some embodiments, the light emitting device may further include an electron injection layer between the second electron transport layer and the cathode, and the second electron transport layer may further include a third material.

In some embodiments, at least one of $R_1$ and $R_2$ may be a carbazole group.

In some embodiments, the carbazole group may include a phenyl group as a substituent.

In some embodiments, at least one of $R_1$ and $R_2$ may be a phenyl group.

In some embodiments, at least one of $R_1$ and $R_2$ may be biphenyl group.

In some embodiments, at least one of $R_3$ and $R_4$ may be a deuterium-substituted or unsubstituted biphenyl group.

In some embodiments, at least one of $R_3$ and $R_4$ may be a perdeuterated biphenyl group.

In some embodiments, at least one of $R_3$ and $R_4$ may be a deuterium-substituted or unsubstituted dimethylfluorene group.

In some embodiments, at least one of $R_3$ and $R_4$ may be a perdeuterated dimethylfluorene group.

In some embodiments, at least one of $R_3$ and $R_4$ may be a deuterium-substituted or unsubstituted carbazole group.

In some embodiments, at least one of $R_3$ and $R_4$ may be a perdeuterated carbazole group.

In some embodiments, the carbazole group may include a deuterium-substituted or unsubstituted phenyl group as a substituent.

In some embodiments, at least one of $R_3$ and $R_4$ may be a deuterium-substituted or unsubstituted dibenzofuran group.

In other example embodiments of the present disclosure, a light emitting display includes a substrate including a plurality of subpixels, each of the subpixels includes a thin film transistor disposed therein, and a light emitting device connected to the thin film transistor, the light emitting device including an anode and a cathode facing each other, a first stack and a second stack disposed between the anode and the cathode, the first stack including a first electron transport layer includes a first material represented by Formula 1, a first electron-blocking layer including a second material including a spirofluorene group, and at least one hydrogen atom on at least one side of the spirofluorene group is substituted by deuterium, and a first blue light emitting layer containing a boron-based compound emitting light having a wavelength of 430 nm to 480 nm, and the second stack including at least two phosphorescent light emitting layers emitting light having a longer wavelength than a wavelength of light emitted by the first blue light emitting layer; and a charge generation layer disposed between the first stack and the second stack, wherein the Formula 1 is:

[Formula 1]

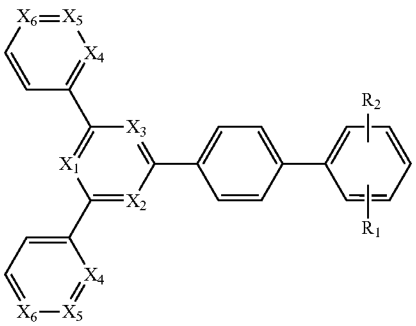

$R_1$ and $R_2$ are each independently selected from a cycloalkyl group, an aryl group, and a heteroaryl group, $X_1$, $X_2$, and $X_3$ are each independently N or CH, and $X_4$, $X_5$ or $X_6$ is N, and remaining of $X_4$, $X_5$, and $X_6$ are CH.

The light emitting device according to an example embodiment of the present disclosure and a light emitting display including the same have the following effects.

First, the material of the electron transport layer in contact with the fluorescent blue light emitting layer, which has limited internal quantum efficiency, is changed in the fluorescent light emitting stack connected to a phosphorescent light emitting stack and a charge generation layer, so the electron transport efficiency may be enhanced and thus the efficiency of the fluorescent light emitting layer may be improved.

Second, when the electron transport layer is formed using a material capable of rapidly transporting electrons, the material of the electron-blocking layer in contact with the fluorescent blue light emitting layer is substituted with deuterium, thereby preventing or reducing accumulation of electrons or excitons at the interface between the fluorescent blue light emitting layer and the electron-blocking layer and obtaining the effect of improving efficiency, luminance, and quantum efficiency without reducing the lifespan.

Third, improving the efficiency of the blue fluorescent stack including the fluorescent blue light emitting layer may reduce the number of blue stacks in a light emitting device realizing white light, and may thus reduce the number of stacks to realize white with the same efficiency, thereby improving yield based on reduced driving voltage and simplified processing.

It will be apparent to those skilled in the art that various modifications and variations may be made in the present disclosure without departing from the spirit or scope of the disclosure. Thus, it is intended that the present disclosure covers such modifications and variations thereto, provided they fall within the scope of the appended claims and their equivalents.

What is claimed is:

1. A light emitting device comprising:

an anode and a cathode facing each other;

a first stack and a second stack disposed between the anode and the cathode, the first stack comprising:

a first electron transport layer comprising a first material represented by Formula 1;

a first blue light emitting layer containing a boron-based compound emitting light having a wavelength of 430 nm to 480 nm; and a first electron-blocking layer comprising a second material comprising a spirofluorene group, and at least one hydrogen atom on at least one side of the spirofluorene group is substituted by deuterium, and the second stack comprising at least two phosphorescent light emitting layers emitting light having a longer wavelength than a wavelength of light emitted by the first blue light emitting layer; and a charge generation layer disposed between the first stack and the second stack, wherein the Formula 1 is:

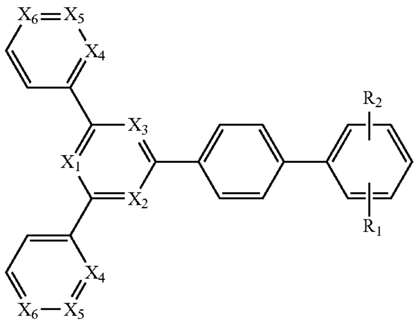

wherein $R_1$ and $R_2$ are each independently selected from a cycloalkyl group, an aryl group, and a heteroaryl group;

$X_1$, $X_2$, $X_3$, $X_4$, $X_5$, and $X_6$ are each independently N or CH; and among $X_4$, $X_5$ and $X_6$, at least one is N.

2. The light emitting device according to claim 1, wherein the second material comprises a compound represented by Formula 2 below:

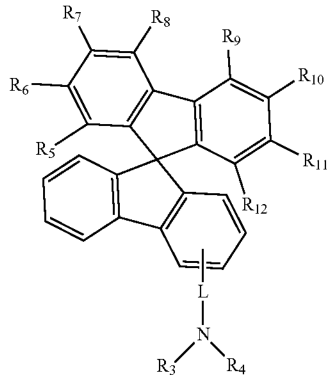

wherein L is a single bond, or is selected from a deuterium-substituted or unsubstituted phenylene group and a deuterium-substituted or unsubstituted naphthylene group;

$R_3$ and $R_4$ are each independently selected from a deuterium-substituted phenyl group, a deuterium-substituted or unsubstituted biphenyl group, a deuterium-substituted or unsubstituted dimethylfluorene group, and a deuterium-substituted or unsubstituted heteroaryl group; and $R_5$ to $R_{12}$ are each a deuterium.

3. The light emitting device according to claim 2, wherein:

the first electron-blocking layer is in contact with one surface of the first blue light emitting layer, the first electron transport layer is in contact with the other surface of the first blue light emitting layer, and the one surface and the other surface of the first blue light emitting layer face each other with a gap therebetween corresponding to a thickness of the first blue light emitting layer.

4. The light emitting device according to claim 1, wherein the at least two phosphorescent light emitting layers comprises:

a red light emitting layer adjacent to the first stack; and a green light emitting layer adjacent to the cathode.

5. The light emitting device according to claim 4, wherein the at least two phosphorescent light emitting layers further comprises a yellowish green light emitting layer between the red light emitting layer and the green light emitting layer.

6. The light emitting device according to claim 2, further comprising at least one stack between the second stack and the cathode, wherein the at least one stack between the second stack and the cathode comprises:

a second electron-blocking layer including the second material;

a second blue light emitting layer emitting the same color as the first blue light emitting layer; and a second electron transport layer including the first material.

7. The light emitting device according to claim 6, further comprising an electron injection layer between the second electron transport layer and the cathode, wherein the second electron transport layer further comprises a third material.

8. The light emitting device according to claim 1, wherein at least one of $R_1$ and $R_2$ is a carbazole group.

9. The light emitting device according to claim 8, wherein the carbazole group includes a phenyl group as a substituent.

10. The light emitting device according to claim 1, wherein at least one of $R_1$ and $R_2$ is a phenyl group or a biphenyl group.

11. The light emitting device according to claim 2, wherein at least one of $R_3$ and $R_4$ includes at least one of a biphenyl group, a dimethylfluorene group, a carbazole group, and a dibenzofuran group.

12. The light emitting device according to claim 2, wherein at least one of $R_3$ and $R_4$ includes at least one a deuterium-substituted biphenyl group, a deuterium-substituted dimethylfluorene group, a deuterium-substituted carbazole group, and a deuterium-substituted dibenzofuran group.

13. The light emitting device according to claim 2, wherein at least one of $R_3$ and $R_4$ includes a perdeuterated biphenyl group, a perdeuterated dimethylfluorene group or a perdeuterated carbazole group.

14. The light emitting device according to claim 13, wherein the carbazole group includes a deuterium-substituted or unsubstituted phenyl group as a substituent.

15. A light emitting display comprising:

a substrate including a plurality of subpixels, each of the subpixels includes a thin film transistor disposed therein; and a light emitting device connected to the thin film transistor, the light emitting device comprising:

an anode and a cathode facing each other;

a first stack and a second stack disposed between the anode and the cathode, the first stack comprising:

a first electron transport layer comprises a first material represented by Formula 1;

a first electron-blocking layer comprising a second material comprising a spirofluorene group, and at least one hydrogen atom on at least one side of the spirofluorene group is substituted by deuterium; and a first blue light emitting layer containing a boron-based compound emitting light having a wavelength of 430 nm to 480 nm, and the second stack comprising at least two phosphorescent light emitting layers emitting light having a longer wavelength than a wavelength of light emitted by the first blue light emitting layer; and a charge generation layer disposed between the first stack and the second stack, wherein the Formula 1 is:

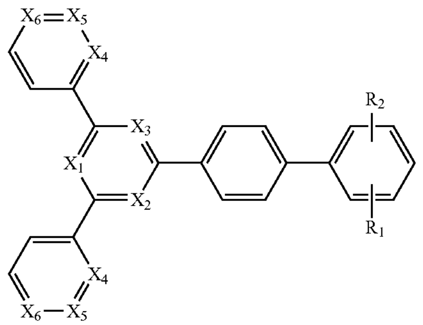

wherein $R_1$ and $R_2$ are each independently selected from a cycloalkyl group, an aryl group, and a heteroaryl group;

$X_1$, $X_2$, ${}_3$, $X_4$, $X_5$, and $X_6$ are each independently N or CH; and among $X_4$, $X_5$ and $X_6$, at least one is N.

16. The light emitting device according to claim 15, wherein:

the first electron-blocking layer is in contact with one surface of the first blue light emitting layer, the first electron transport layer is in contact with the other surface of the first blue light emitting layer, and the one surface and the other surface of the first blue light emitting layer face each other with a gap therebetween corresponding to a thickness of the first blue light emitting layer.

17. The light emitting device according to claim 15, wherein the at least two phosphorescent light emitting layers comprise:

a red light emitting layer adjacent to the first stack; and a green light emitting layer adjacent to the cathode.

18. The light emitting device according to claim 17, wherein the at least two phosphorescent light emitting layers further comprises a yellowish green light emitting layer between the red light emitting layer and the green light emitting layer.

19. The light emitting device according to claim 16, further comprising at least one stack between the second stack and the cathode, wherein the at least one stack between the second stack and the cathode comprises:

a second electron-blocking layer including the second material;

a second blue light emitting layer emitting the same color as the first blue light emitting layer; and a second electron transport layer including the first material.

20. The light emitting device according to claim 19, further comprising an electron injection layer between the second electron transport layer and the cathode, wherein the second electron transport layer further comprises a third material.

* * * * *